(12) United States Patent
Aung et al.

(10) Patent No.: US 7,333,570 B2
(45) Date of Patent: Feb. 19, 2008

(54) CLOCK DATA RECOVERY CIRCUITRY ASSOCIATED WITH PROGRAMMABLE LOGIC DEVICE CIRCUITRY

(75) Inventors: Edward Aung, San Leandro, CA (US); Henry Lui, San Jose, CA (US); Paul Butler, Mesa, AZ (US); John Turner, Santa Cruz, CA (US); Rakesh Patel, Cupertino, CA (US); Chong Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 764 days.

(21) Appl. No.: 10/454,731

(22) Filed: Jun. 3, 2003

(65) Prior Publication Data

US 2003/0212930 A1 Nov. 13, 2003

Related U.S. Application Data

(63) Continuation-in-part of application No. 09/805,843, filed on Mar. 13, 2001.

(60) Provisional application No. 60/189,212, filed on Mar. 14, 2000.

(51) Int. Cl.
*H04L 27/00* (2006.01)
(52) U.S. Cl. .................. 375/326; 375/354; 375/371
(58) Field of Classification Search ............... 375/326, 375/316, 324, 354, 371, 373, 376, 355, 362; 327/277, 149
See application file for complete search history.

(56) References Cited

U.S. PATENT DOCUMENTS 3,473,160 A 10/1969 Wahlstrom ............... 340/172.5
4,229,825 A 10/1980 Guidoux
4,680,779 A 7/1987 Wakerly
5,034,967 A 7/1991 Cox et al.
5,084,891 A 1/1992 Ariyavisitakul et al.
5,162,762 A 11/1992 Flanagan (Continued)

FOREIGN PATENT DOCUMENTS

GB 2 011 764 7/1979

(Continued)

OTHER PUBLICATIONS

Jason Konstas, *Converting Wide, Parallel Data Buses to High Speed Serial Links*, International IC '99 Conference Proceedings, pp. 19-30 (1991).

(Continued)

*Primary Examiner*—Kevin Burd
(74) *Attorney, Agent, or Firm*—Ropes & Gray LLP; Robert R. Jackson; Michael J. Chasan

(57) ABSTRACT

A programmable logic device ("PLD") is augmented with programmable clock data recover ("CDR") circuitry to allow the PLD to communicate via any of a large number of CDR signaling protocols. The CDR circuitry may be integrated with the PLD, or it may be wholly or partly on a separate integrated circuit. The circuitry may be capable of CDR input, CDR output, or both. The CDR capability may be provided in combination with other non-CDR signaling capability such as non-CDR low voltage differential signaling ("LVDS"). The circuitry may be part of a larger system.

17 Claims, 20 Drawing Sheets

U.S. PATENT DOCUMENTS

| | | | |
|---|---|---|---|
| 5,184,350 A | 2/1993 | Dara | |
| 5,256,918 A | 10/1993 | Suzuki | |
| 5,357,249 A | 10/1994 | Azaren et al. | |
| 5,457,717 A | 10/1995 | Bellamy | |
| 5,481,563 A | 1/1996 | Hamre | |
| 5,483,180 A | 1/1996 | Chai et al. | |
| 5,552,942 A | 9/1996 | Ziperovich et al. | |
| 5,610,953 A * | 3/1997 | Betts et al. | 375/373 |
| 5,689,195 A | 11/1997 | Cliff et al. | 326/41 |
| 5,726,988 A | 3/1998 | Riley | |
| 5,757,240 A | 5/1998 | Boerstler et al. | |
| 5,760,844 A | 6/1998 | Jorden | |
| 5,781,038 A | 7/1998 | Ramamurthy et al. | |
| 5,793,822 A | 8/1998 | Anderson et al. | |
| 5,802,103 A | 9/1998 | Jeong | 375/220 |
| 5,838,749 A | 11/1998 | Casper et al. | |
| 5,896,067 A | 4/1999 | Williams | |
| 5,896,561 A | 4/1999 | Schrader et al. | |
| 5,909,126 A | 6/1999 | Cliff et al. | 326/41 |
| 5,917,850 A * | 6/1999 | Fujita et al. | 375/150 |
| 5,920,600 A | 7/1999 | Yamaoka et al. | |
| 5,963,608 A | 10/1999 | Casper et al. | |
| 5,974,464 A | 10/1999 | Shin et al. | |
| 5,987,543 A | 11/1999 | Smith | |
| 5,999,025 A | 12/1999 | New | |
| 6,008,680 A * | 12/1999 | Kyles et al. | 327/277 |
| 6,031,428 A | 2/2000 | Hill | 331/11 |
| 6,031,473 A | 2/2000 | Kubinec | |
| 6,091,261 A | 7/2000 | De Lange | |
| 6,166,572 A * | 12/2000 | Yamaoka | 327/149 |
| 6,178,213 B1 | 1/2001 | McCormack et al. | |
| 6,215,326 B1 | 4/2001 | Jefferson et al. | 326/41 |
| 6,223,089 B1 | 4/2001 | Page | |
| 6,256,722 B1 | 7/2001 | Acton et al. | |
| 6,259,271 B1 | 7/2001 | Couts-Martin et al. | |
| 6,266,799 B1 | 7/2001 | Lee et al. | |
| 6,292,116 B1 | 9/2001 | Wang et al. | |
| 6,295,563 B1 | 9/2001 | Whittaker | |
| 6,327,196 B1 | 12/2001 | Mullarkey | |
| 6,341,142 B2 | 1/2002 | Ducaroir et al. | |
| 6,374,361 B1 | 4/2002 | Lee et al. | |
| 6,400,291 B1 | 6/2002 | Sankey | |
| 6,407,576 B1 | 6/2002 | Ngai et al. | 326/41 |
| 6,421,796 B1 | 7/2002 | Gatherer | |
| 6,463,109 B1 | 10/2002 | McCormack et al. | |
| 6,538,656 B1 | 3/2003 | Cheung et al. | |
| 6,631,144 B1 | 10/2003 | Johansen | |
| 6,650,720 B1 | 11/2003 | Grung et al. | |
| 6,834,367 B2 | 12/2004 | Bonneau et al. | |
| 6,917,661 B1 | 7/2005 | Scott et al. | |
| 2002/0110211 A1* | 8/2002 | Bockelman | 375/371 |
| 2002/0190751 A1 | 12/2002 | Lee et al. | 326/39 |
| 2003/0052709 A1 | 3/2003 | Venkata et al. | 326/37 |

FOREIGN PATENT DOCUMENTS

| | | |
|---|---|---|
| JP | 63-121344 | 5/1988 |
| JP | 63-108238 | 7/1988 |
| JP | 4-199912 | 7/1992 |
| JP | 04287439 | 10/1992 |
| JP | 05199107 | 8/1993 |
| JP | 6-48243 | 6/1994 |
| JP | 6-327072 | 11/1994 |
| JP | 7-58731 | 3/1995 |
| JP | 08032569 | 2/1996 |
| JP | 9-149017 | 6/1997 |
| JP | 10-134523 | 5/1998 |
| JP | 11-317730 | 11/1999 |
| JP | 11-317731 | 11/1999 |

OTHER PUBLICATIONS

Helmuth Lemme, *Schnelle Chips Für "Flaschenhälse,"* Elektonik, vol. 40, No. 22, Oct. 29, 1991, pp. 104-109.

Barry M. Cook, *IEEE 1355 Data-Strobe Links: ATM Speed at RS232 Cost*, Microprocessors and Microsystems, vol. 21, No. 7-8, Mar. 30, 1998, pp. 421-428.

*Protocol Independent Gigabit Backplane Transceiver Using Lucent ORT4622/ORT8850 FPSCs*, Lucent Technologies, Microelectronics Group, Application Note, Jun. 2000, pp. 1-10.

*Lucent Introduces 10Gb/s Ethernet FPGAs*, Programmable Logic News and Views, Electronic Trend Publications, Inc., vol. IX, No. 11, Nov. 2000, pp. 7-8.

*ORCA ORT82G5 0.622/1.0-1.25/2.0-2.5/3.125 Gbits/s Backplane Interface FPSC*, Lucent Technologies, Microelectronics Group, Product Brief, Feb. 2001, pp. 1-8.

Ankit Seedher et al., "Fractional Rate Phase Detectors for Clock and Data Recovery," IEEE, pp. 313-316, 2003.

Charles R. Hogge, Jr., "A Self Correcting Clock Recovery Circuit," IEEE Transactions On Electron Devices, vol. ED-32, No. 12, pp. 2704-2706, Dec. 1985.

Fong, Thomas Kin Tak, "Advanced clock recovery techniques for high-speed packet-switched optical networks," ProQuest, Abstract (Document Summary), 1995.

German Gutierrez et al., "Unaided 2.5 Gb/s Silicon Bipolar Clock and Data Recovery IC," IEEE Radio Frequency Integrated Circuits Symposium, VIII-7, pp. 173-176, 1998.

Ilya I. Novof et al., "Fully Integrated CMOS Phase-Locked Loop with 15 to 240 MHz Locking Range and ±50 ps Jitter," IEEE Journal Of Solid-State Circuits, vol. 30, No. 11, pp. 1259-1266, Nov. 1995.

M. Rau, et al., "Clock/Data Recovery PLL Using Half-Frequency Clock," IEEE Journal Of Solid-State Circuits, vol. 32, No. 7, Jul. 1997.

Ricardo Monleone, "Clock-recovery PLL fits into single PLD," EDN, pp. 88-92, Nov. 23, 1995.

Timothy H. Hu et al., "A Monolithic 480 Mb/s parallel AGC/Decision/Clock-Recovery Circuit in 1.2-μm CMOS," IEEE Journal Of Solid-State Circuits, vol. 28, No. 12, Dec. 1993.

* cited by examiner

CLOCK DATA RECOVERY CIRCUITRY ASSOCIATED WITH PROGRAMMABLE LOGIC DEVICE CIRCUITRY

This is a continuation-in-part of U.S. patent application Ser. No. 09/805,843, filed Mar. 13, 2001, which claims the benefit of U.S. provisional patent application No. 60/189,212, filed Mar. 14, 2000, both of which prior applications are hereby incorporated by reference herein in their entireties.

BACKGROUND OF THE INVENTION

This invention relates to clock data recovery circuitry, and more particularly to clock data recovery circuitry that can be provided on or in association with programmable logic devices.

An increasingly important type of signaling between devices is signaling in which the clock signal information is embedded in a serial data stream so that no separate clock signal needs to be transmitted. For example, data may be transmitted serially in "packets" of several successive serial data words preceded by a serial "header" that includes several training bits having a predetermined pattern of binary ones and zeros. The clock signal information is embedded in the data signal by the high-to-low and/or low-to-high transitions in that signal, which must have at least one high-to-low or low-to-high transition within a certain number of clock signal cycles. At the receiver the clock signal is "recovered" from the data signal for use in properly processing the data in the data signal. For convenience herein this general type of signaling will be referred to generically as "clock data recovery" or "CDR" signaling.

CDR signaling is now being used in many different signaling protocols. These protocols vary with respect to such parameters as clock signal frequency, header configuration, packet size, data word length, number of parallel channels, etc.

Programmable logic devices ("PLDs") are well known as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

CDR signaling is an area in which it would be highly desirable to have the ability to use PLDs to avoid having to always design and build CDR transmitters and receivers that are specific to each of the many different CDR protocols.

SUMMARY OF THE INVENTION

In accordance with this invention, CDR circuitry is provided which may include CDR receiver circuitry, CDR transmitter circuitry, and/or both CDR receiver circuitry and CDR transmitter circuitry. The CDR circuitry of this invention is preferably programmable in at least some respects and may either be included on an integrated circuit with other more traditional PLD circuitry, or it may be at least partly included on a separate integrated circuit. If the CDR circuitry is at least partly on a separate circuit, it may be configured to facilitate efficient coupling to a more traditional PLD integrated circuit (e.g., in a common package with the PLD).

CDR receiver circuitry in accordance with the invention preferably receives a separate, additional reference clock signal from the source of the CDR data signal to be processed or from another suitable reference clock signal source. The frequency of the reference clock signal has a known relationship to the clock frequency of the CDR data signal, but it does not have to be in phase with the CDR data signal. The requirement for a separate reference clock signal deviates from typical CDR signaling, but it helps make it possible for the circuitry of this invention to be programmable to operate at any of wide range of CDR frequencies. And because the separate reference clock signal is not required to have any particular phase relationship to the CDR data signal, there are no constraints regarding possible skew (i.e., phase shift) between the reference clock signal and the CDR data signal. (Problems associated with skew are among the principal motivations for using CDR signaling, because with CDR signaling the clock signal is embedded in the data signal and therefore can never become skewed relative to the data signal.) The CDR receiver circuitry uses the reference clock signal and the CDR data signal to recover the embedded clock signal from the CDR data signal. Various parameters used in this recovery of the CDR data signal clock are preferably programmable. The recovered clock signal may be used to deserialize the CDR data signal, again using preferably programmable parameters such as a word length parameter. The deserialized data may then be synchronized or buffered for processing in a different clock regime (e.g., in accordance with a clock signal in more traditional PLD circuitry that is associated with the CDR circuitry).

CDR transmitter circuitry in accordance with the invention also preferably receives a separate, additional reference clock signal from the intended destination of the CDR data signal to be transmitted or from another suitable reference clock signal source. This reference clock signal has characteristics similar to those described above for the reference clock signal used by the CDR receiver circuitry. The source of the data to be transmitted may be traditional PLD circuitry associated with the CDR transmitter circuitry. The data to be transmitted may be presented as successive words of several parallel bits. Various characteristics of this data (e.g., word frequency, word length, etc.) are preferably selectable (i.e., programmable). The reference clock signal mentioned earlier in this paragraph may be processed in accordance with preferably programmable parameters and may then be used to synchronize the flow of the data to be transmitted into the CDR transmitter circuitry. The processed reference clock signal may also be used to serialize the bits of each word of the data to be transmitted, preferably in accordance with a word length parameter which is programmably selectable. The resulting CDR data signal is then output by the CDR transmitter circuitry.

In addition to the aspects of programmability that have already been mentioned, the CDR receiver and/or transmitter circuitry of this invention may also be programmable in other respects. For example, the CDR circuitry may include the capability of operating selectable numbers of CDR data receiver and/or transmitter subcircuits in parallel. As another example, the CDR circuitry may include the capability of handling a selectable number of different reference clock signals in parallel, and therefore operating a selectable number of different CDR receivers and/or transmitters in parallel.

The circuitry of this invention may also be programmable to alternatively support other types of non-CDR signaling such as non-CDR low-voltage differential signaling ("LVDS"). The circuitry of this invention may be constructed to provide signals such as loss of lock and run length violation signals that can be used as indications that various parts of the circuitry need to be reset. Circuitry for facilitating reset and/or power down of various portions of the circuitry can also be provided. Circuitry for selectively creating various types of test loops in the circuitry may be provided to facilitate testing various portions of the circuitry. Circuitry for programmably modifying a reference clock signal in certain modes of operation (especially a reference clock signal output by the programmable logic device) may also be provided.

Because the invention facilitates handling CDR data with a PLD, the logic of the PLD can be used to manipulate the data in accordance with whatever protocol is being used (e.g., with respect to such aspects as byte alignment, comma detect, word length, or any other aspect of decoding the data on the receiver side and/or encoding the data on the transmitter side). The present combination of CDR and PLD circuitry is therefore very advantageous.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
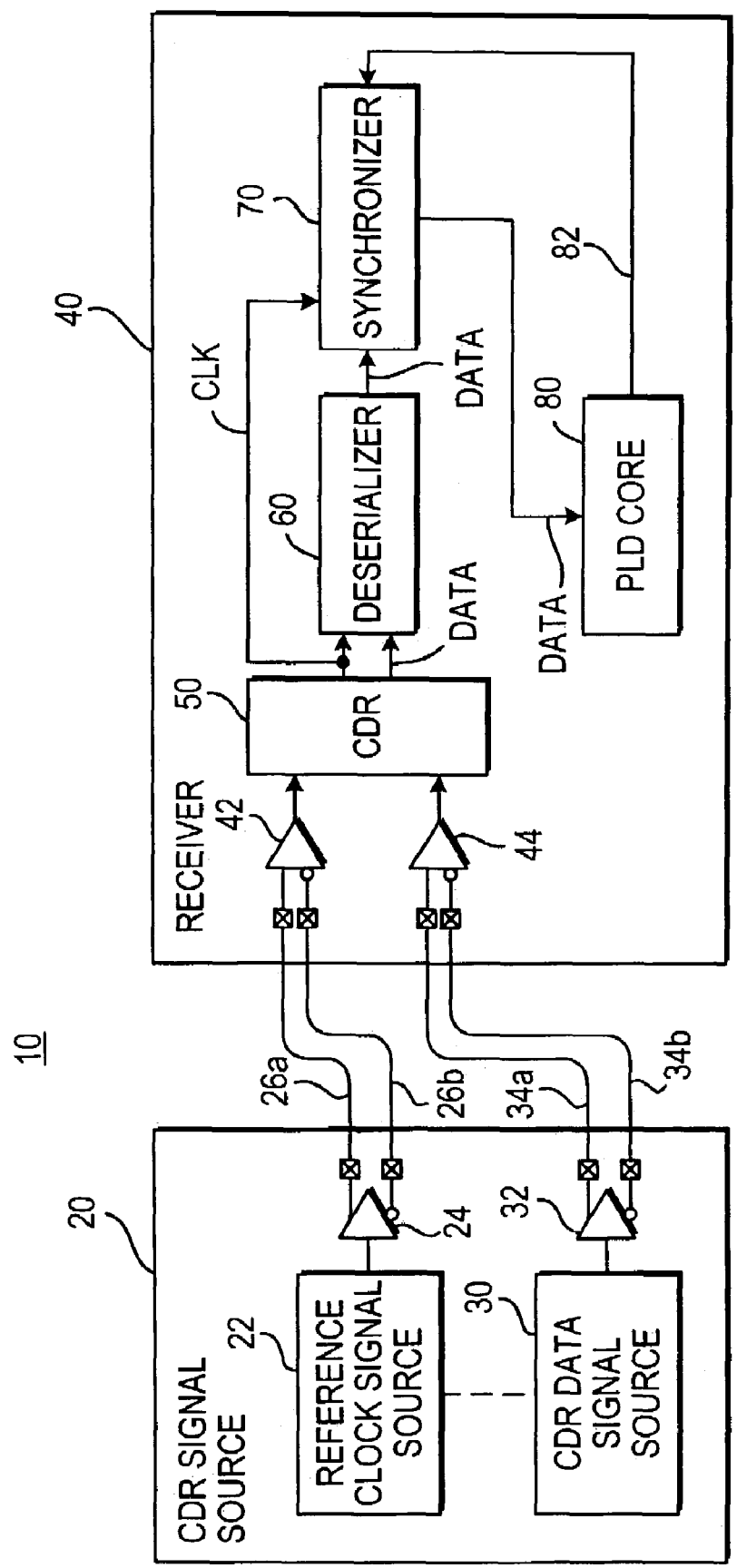
FIG. 1 is a simplified schematic block diagram of an illustrative embodiment of CDR signaling apparatus in accordance with the invention.

FIG. 1 shows an illustrative embodiment of CDR signaling apparatus 10 in accordance with the invention. This apparatus includes CDR signal source 20 and receiver 40. Although elements 20 and 40 could be on the same integrated circuit, that is generally not the case and they are more typically portions of separate integrated circuits or circuit assemblies. For example, in systems like those shown in FIG. 12, receiver 40 could be part of element 500/600, while source 20 could be part of any other element(s) 1004, 1006, 1008, and/or 1010.

CDR signal source 20 includes reference clock signal source 22 and CDR data signal source 30, which can be conventional or substantially conventional. Reference clock signal source 22 produces a reference clock signal having a precise frequency relationship to the clock frequency embedded in the CDR data signal produced by CDR data signal source 30. For example, reference clock signal source 22 can produce a reference clock signal having the same frequency as the clock frequency embedded in the CDR data signal or any convenient fraction or multiple of the embedded clock frequency. In particular, the reference clock signal frequency REFCLK is related to the embedded clock frequency EMBCLK by the following relationship:

$$REFCLK \star W = EMBCLK,$$

where W is a convenient scale factor such as 0.5, 1, 2, 4, etc. The dotted line between elements 22 and 30 indicates that there is such a frequency relationship between the outputs of those elements, and indeed the reference clock signal produced by source 22 (or some frequency-divided or frequency-multiplied version of that signal) may be used by element 30 to establish the frequency of the CDR data signal. There does not, however, need to be any particular phase relationship between the output signals of elements 22 and 30.

The output signal of reference clock signal source 22 is applied to conventional differential signaling driver 24 to produce a pair of differential REFCLK output signals on leads 26a and 26b. (This is optional. The reference clock signal could instead be transmitted between elements 20 and 40 as a single signal on a single lead if desired.)

As has been mentioned, CDR data signal source 30 can be a conventional source of a CDR data signal. That signal is applied to conventional differential signaling driver 32 to produce a pair of differential CDR data output signals on leads 34a and 34b. (Once again, differential signaling for the CDR data signal is optional, and the CDR data signal could instead be transmitted between elements 20 and 40 via a single lead.)

At receiver 40 the differential REFCLK signals on leads 26a and 26b are applied to conventional differential driver 42 in order to convert the received REFCLK signals back to a signal on a single lead for application to CDR circuitry 50. Similarly, the differential CDR data signals on leads 34a and 34b are applied to conventional differential driver 44 in order to convert the received CDR data signals back to a signal on a single lead for application to CDR circuitry 50.

CDR circuitry 50 uses the received REFCLK and CDR data signals to extract from the CDR data signal a clock signal and a data signal. These signals are applied to deserializer 60, which converts the applied serial data to parallel data. The parallel data signals are applied to synchronizer 70 in synchronism with the clock signal produced by CDR circuitry 50. Synchronizer 70 buffers the parallel data for ultimate application to PLD core 80 in synchronism with another clock signal 82 supplied to synchronizer 70 by PLD core 80.

Figure 1A:
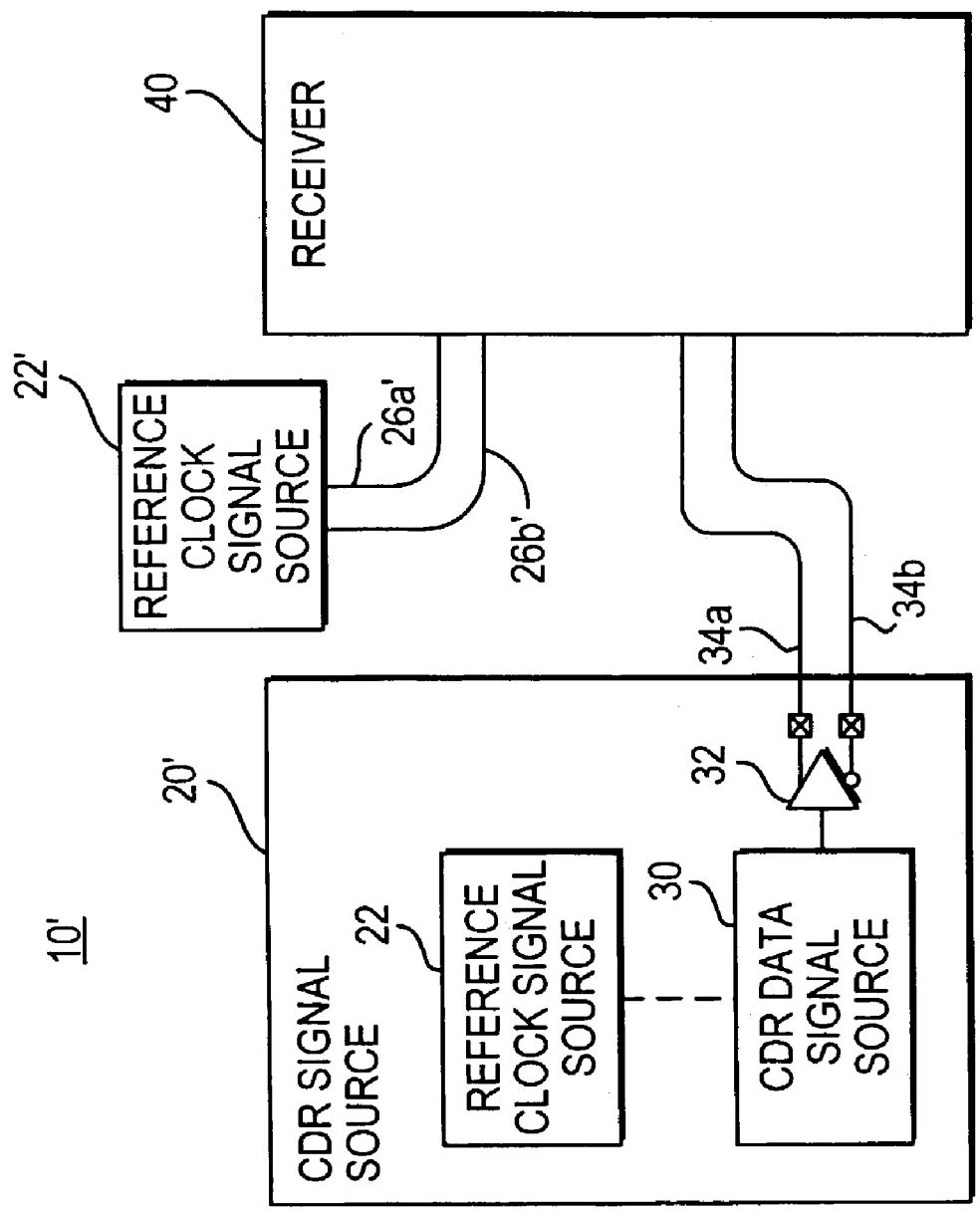
FIG. 1A is a simplified schematic block diagram showing an alternative embodiment of CDR signaling apparatus in accordance with the invention.

FIG. 1A shows an alternative embodiment of CDR signaling apparatus 10' in which the reference clock signal source 22' used by receiver 40 is separate from CDR signal source 20'. CDR signal source 20' may be basically the same as CDR signal source 20 in FIG. 1 except that it does not need elements like 24 for outputting the reference clock signal for conveyance to receiver 40. Instead, a separate reference clock signal source 22' supplies the reference clock signal to receiver 40 via leads 26a' and 26b'. Reference clock signal source 22' can be similar to reference clock signal source 22 in FIG. 1, and everything said about source 22 in FIG. 1 is equally applicable to source 22' in FIG. 1A (except, of course, that source 22' is separate from source 20' and does not provide an input or clock reference to source 30). In addition it should be said that although there needs to be a precise, known, frequency relationship between sources 22 and 22', the frequencies of those sources do not have to be the same (again, scale factors like 0.5, 1, 2, 4, etc., can exist between these frequencies), and no particular phase relationship is required between sources 22 and 22'. Receiver 40 in FIG. 1A can be the same as receiver 40 in FIG. 1.

Configurations of the type shown in FIG. 1A can be used when source 20' and receiver 40 are relatively far apart, possibly making it undesirable to have to run both CDR data leads 34 and reference clock leads 26 between widely spaced elements 20' and 40. In that event, source 22' can be placed relatively close to receiver 40 so that only leads 34 need to be relatively long, while leads 26' can be relatively short. As a specific illustration, elements 20' and 40 may be on respective different continents, with source 22' being located near receiver 40 so that only intercontinental links are needed for the CDR data signals 34 themselves. (In this connection it should be pointed out that just as any of links 34, 26, 26' can alternatively be single signals, they can alternatively be transmitted (in whole or in part) by means other than wire leads. For example, they can be wholly or partly transmitted by radio, light, or in any other suitable and desired way. The same is true for the signals requiring transmission in other embodiments such as the ones shown in FIGS. 7 and 7A.)

Figure 2:
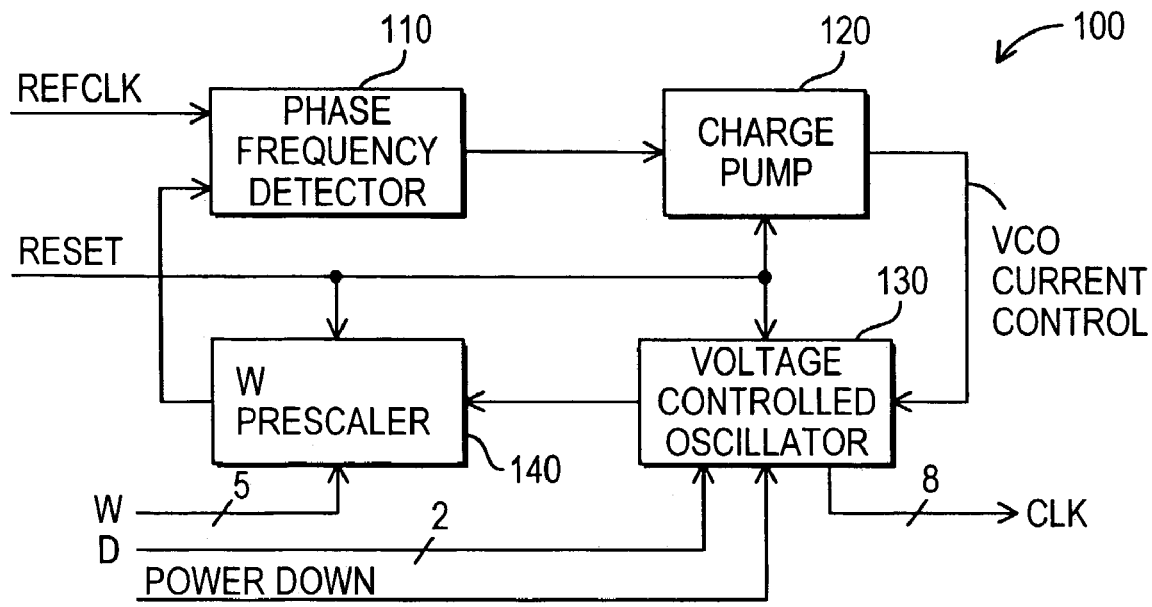
FIG. 2 is a more detailed, but still simplified, block diagram of an illustrative embodiment of a portion of the FIG. 1 apparatus in accordance with the invention.

An illustrative embodiment of a portion 100 of CDR circuitry 50 is shown in more detail in FIG. 2. Circuitry 100 is basically a phase locked loop ("PLL") circuit and it will therefore sometimes be referred to as such herein. PLL 100 includes phase frequency detector ("PFD") circuit 110, which receives the REFCLK signal output by buffer 42 in FIG. 1 and the output signal of W prescaler circuit 140. PFD 110, which can be conventional, compares the phase and frequency of the two signals it receives and outputs a signal indicative of whether the output signal of prescaler 140 should be speeded up or slowed down to better match the phase and frequency of the REFCLK signal. Charge pump circuit 120 (which can also be conventional) integrates the output signal of PFD 110 and produces a VCO current control signal appropriate to controlling voltage controlled oscillator ("VCO") 130 in the manner required to make the output signal of VCO 130 (after processing by W prescaler 140) better match the REFCLK signal with respect to phase and frequency. The output signal of VCO 130 is applied to W prescaler 140, which divides the VCO output signal frequency by a scale factor W in order to produce one of the two signals applied to PFD 110. Scale factor W is the same value used in the above-mentioned relationship between REFCLK and EMBCLK. W prescaler 140 is preferably programmable or otherwise controllable to operate using any of several values of W. For example, the desired value of W may be stored in one or more programmable function control elements ("FCEs") which are part of receiver 40.

From the description of PLL 100 provided thus far it will be seen that this circuit operates to cause VCO 130 to operate at a frequency which closely matches the EMBCLK frequency. VCO 130 outputs eight clock signals, all having the EMBCLK frequency but shifted in phase relative to one another so that they collectively divide the period of the EMBCLK signal into eight equal time intervals. VCO 130 may be programmable or otherwise controllable by the D signals to help it perform over a wide range of possible operating frequencies. For example, the D signals may control what may be referred to as a "coarse" adjustment of VCO 100, while the VCO current control signal from charge pump 120 is responsible for a "fine" adjustment of the VCO. The desired value of D may be stored in one or more programmable FCEs which are part of receiver 40.

The reset signal shown in FIG. 2 allows PLL 100 to be reset and released to start in a controlled manner. For example, it may be necessary or desirable to reset PLL 100 when a loss-of-lock condition is detected in PLL 100. (This and other aspects of various reset operations are described in more detail later in this specification.) The reset signal resets charge pump 120, VCO 130, and W prescaler 140. The W, D, and reset signals may all come from PLD core 80 (FIG. 1).

The power down signal shown in FIG. 2 allows PLL 100 to be turned off if it is not going to be used. This can be done by having the power down signal turn off the current to VCO 130. In the example of the VCO 130 construction shown in FIG. 3 and described in more detail below, this can be done by turning off current source 131, thereby turning off the current to differential drivers 132. The power down signal may come from an FCE associated with PLL 100. Turning off PLL 100 in this way saves power if the PLL is not going to be used.

Figure 3:
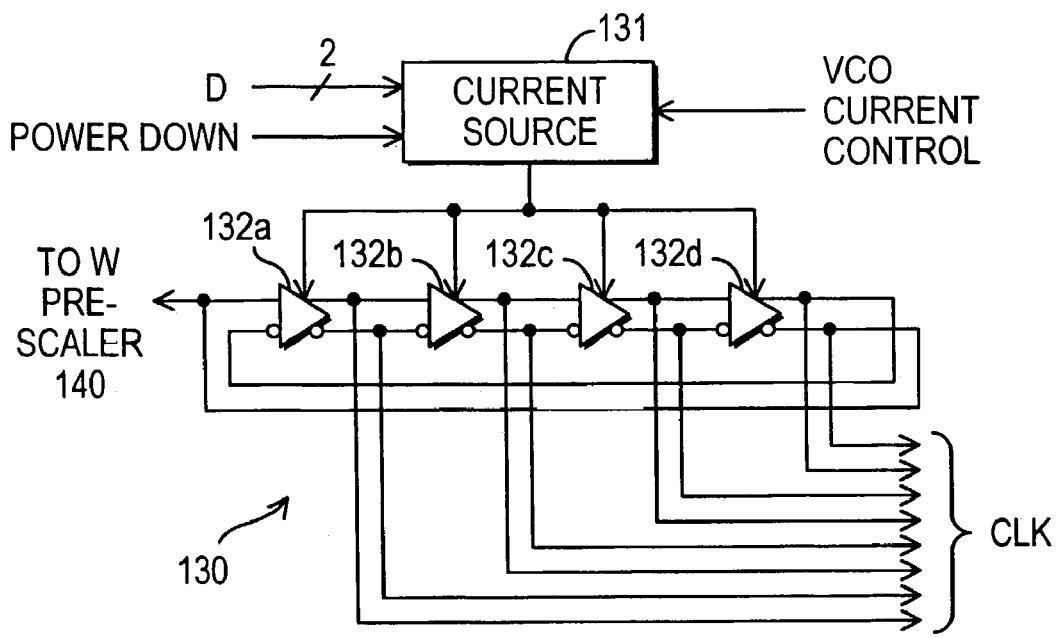
FIG. 3 is a more detailed, but still simplified, schematic diagram of an illustrative embodiment of a portion of the FIG. 2 apparatus in accordance with the invention.

An illustrative construction of VCO 130 is shown in part in more detail in FIG. 3. Differential drivers 132a-d are interconnected in a closed loop series. The time required for a signal transition to make one complete circuit of this loop (via either the true or complement path) is half the period of the clock signal. The speed at which each driver 132 operates, and therefore the signal propagation speed of the loop, is determined (at least to some extent) by the amount of current supplied to the drivers from current source 131. The D signals (mentioned above in connection with FIG. 2) can be used to programmably select any one of several possible current ranges within which current source 131 can operate. The D signals therefore control the above-mentioned "coarse" adjustment of current source 131 and hence VCO 130. The VCO current control signal (from charge pump 120 in FIG. 2) provides additional dynamic control of the current supplied by current source 131. In particular, the VCO current control signal adjusts the current supplied by current source 131 within whatever range has been selected by the D signals. Thus the VCO current control signal provides dynamic "fine" adjustment of current source 131 and hence VCO 130. (The power down signal (also mentioned above in connection with FIG. 2) can be used to programmably turn off current source 131 in the event that PLL 100 is not going to be used at all.)

From the foregoing it will be seen that (within any of several possible frequency ranges selected using the D signals), the frequency of the clock signal can be increased or decreased by changing the VCO current control signal. The true and complement paths through the closed loop of drivers 132 are collectively tapped at eight points that effectively divide the clock signal period into eight equal time intervals. The signals at those eight points are output as the above-mentioned eight, equally phase-shifted, clock signals.

Although single-ended drivers could be used in VCO 130 in place of differential drivers. 132, differential drivers are preferably used for several reasons. One of these reasons is that differential drivers tend to be less susceptible to noise. Differential drivers can be more easily made to operate on smaller input signal swings (e.g., 300 millivolts instead of 3 volts). Differential drivers can also more easily be made faster, better able to resist jitter, and more immune to noise. Another reason that differential drivers are preferred for VCO 130 is that differential output signals are needed from the VCO. It will also be understood that voltage control of VCO 130 could be used in place of the above-described current control, but current control is presently preferred.

Figure 4:
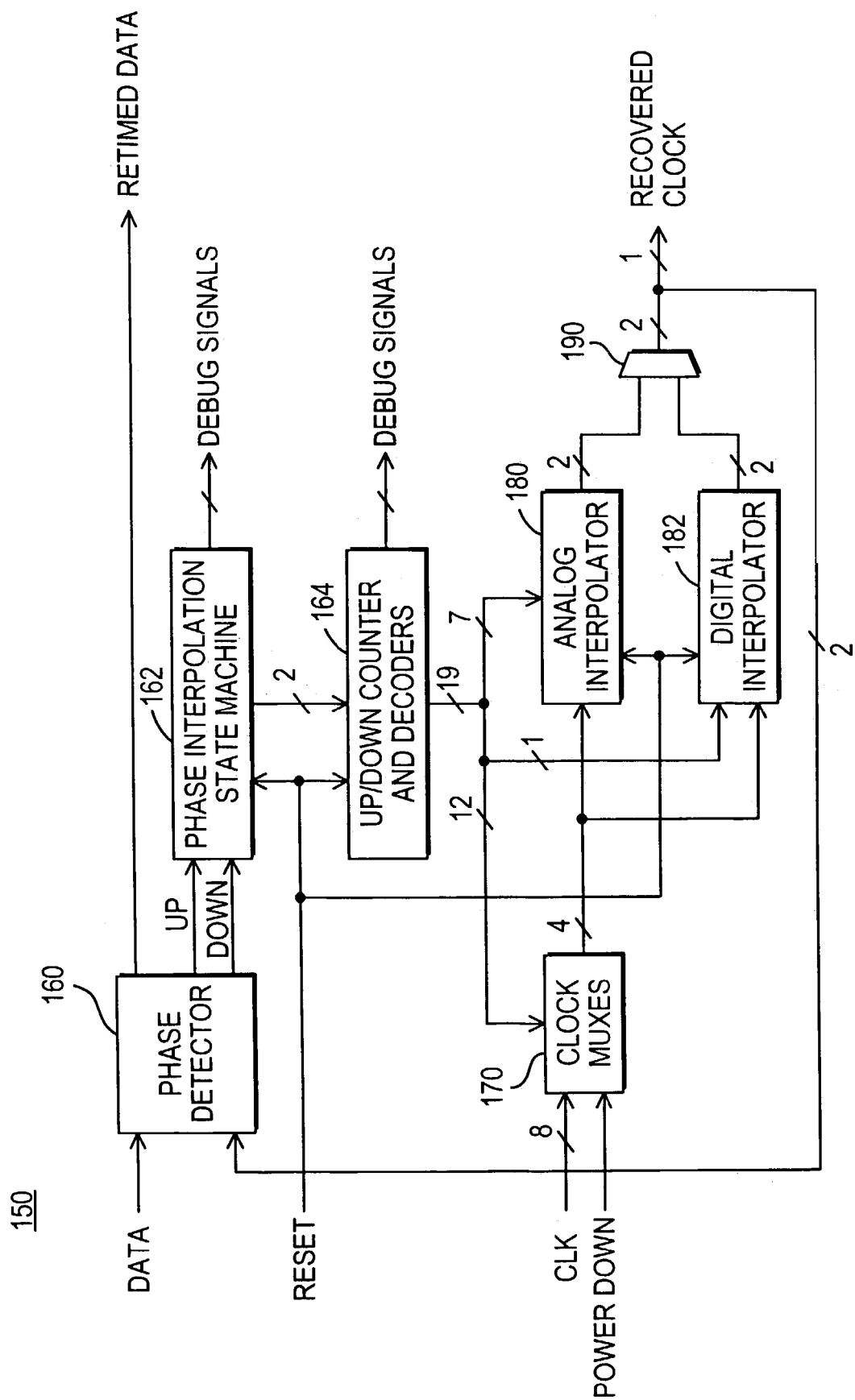
FIG. 4 is a more detailed, but still simplified, block diagram of an illustrative embodiment of another portion of the FIG. 1 apparatus in accordance with the invention.

An illustrative embodiment of a further portion 150 of CDR circuitry 50 is shown in FIG. 4. Unlike PLL 100, which is typically at least predominantly analog circuitry, the circuitry 150 shown in FIG. 4 is preferably digital circuitry. Because it is both digital and operates like a phase locked loop, circuitry 150 is sometimes referred to herein as digital phase locked loop ("DPLL") circuitry 150.

DPLL 150 includes phase detector 160, which receives both the CDR data signal (from driver 44 in FIG. 1) and the clock signals output by multiplexer 190. As will be described more fully below, one of the two output signals of multiplexer 190 is intended for comparison with rising edges in the CDR data signal, while the other of the two output signals of multiplexer 190 is intended for comparison with falling edges in the CDR data signal. Phase detector 160 compares the phases of the signals it receives and produces UP output signal pulses if the clock signals need to be speeded up to better work with the phase of the transitions in the CDR data signal, or DOWN output signal pulses if the clock signals need to be slowed down to better work with the phase of the transitions in the CDR data signal. These UP and DOWN signal pulses are applied to phase interpolation state machine 162.

Phase interpolation state machine 162 responds to each UP and DOWN signal pulse by changing state internally. However, state machine 162 does not produce output signal pulses in response to every UP or DOWN signal pulse it receives. Instead, state machine 162 outputs further UP or DOWN signal pulses only after a trend has emerged in the signals it receives. In other words, state machine 162 acts somewhat like a digital low-pass filter to prevent the rest of the FIG. 4 circuitry from responding too quickly to what may turn out to be only a short-term indication of phase mismatch produced by phase detector 160. State machine 162 therefore builds some desirable latency into the circuitry shown in FIG. 4. (The debug output signals of circuitry 162 are optional and can be used for monitoring circuit performance if desired.)

The UP and DOWN signal pulses that are output by state machine 162 are counted and decoded by up/down counter and decoder circuitry 164. (The debug output signals of circuitry 164 are again optional and are for further monitoring circuit performance.) Some of the outputs of circuitry 164 are used by clock multiplexer circuitry 170 to select (1) the two of the eight clock input signals from PLL 100 that work best with rising edges in the CDR data signal, and (2) the two of the eight clock input signals from PLL 100 that work best with falling edges in the CDR data signal. It should be apparent from what has just been said that each of these pairs of selected clock signals includes signals that are immediately adjacent to one another in phase (among the eight phases available in the eight clock signals). It should also be apparent that each of the signals in each of these pairs will be 180° out of phase with a respective one of the signals in the other pair. Thus from eight input clock signals, circuitry 170 dynamically selects four output clock signals. For example, if the eight input clock signals are numbered 0-7 in phase order, circuitry 170 might during some period of time select clock signals 0 and 1 as best working with rising edges in the CDR data signal, and signals 4 and 5 as best working with falling edges in the CDR data signal. The four clock signals selected by circuitry 170 are applied to analog interpolator 180 and also to digital interpolator 182. The user of the device can elect to use either of these two interpolators.

Analog interpolator 180 operates by dividing into eight equal sub-intervals the time interval between the two clock signals in each pair of clock signals that it receives from circuitry 170. The output signals of circuitry 164 that analog interpolator 180 also receives control the interpolator to select one of these sub-intervals for each pair of clock signals and to produce a shifted clock signal synchronized with that sub-interval. The selected sub-interval (and thus the shifted clock signal) is the one that works best with the appropriate one of rising or falling edges in the CDR data signal. Thus the two shifted clock signals produced by analog interpolator 180 are respectively optimized (or very nearly optimized) to work with rising or falling edges in the CDR data signal. Multiplexer 190 can be programmably controlled (by FCEs) to feed these two signals back to phase detector 160. The signal output by multiplexer 190 to work with rising edges is also the recovered clock output signal of the FIG. 4 circuitry. In addition to its other functions (described above), phase detector 160 passes the CDR data signal through a register that is clocked by one of the signals fed back from multiplexer 190 to produce the retimed data output signal of the FIG. 4 circuitry. This retimed data signal is the data signal that is further processed (using the recovered clock signal) by the apparatus of this invention.

Turning now to digital interpolator 182, this circuitry receives the two pairs of clock signals that are output by circuitry 170 and, based on a control signal from circuitry 164, selects the one signal in each pair with the better timing. Multiplexer 190 can be controlled to output the two signals selected by circuitry 182 for use (in lieu of the output signals of circuitry 180) as described above.

The reset signal shown in FIG. 4 has a purpose generally similar to the reset signal in FIG. 2. Thus, when it is necessary or desirable to reset DPLL 150 (e.g., due to a loss-of-lock condition being detected), the reset signal is asserted to reset elements 162, 164, 180, and 182. Like the reset signal in FIG. 2, the reset signal in FIG. 4 may come from PLD core 80 (FIG. 1).

The power down signal in FIG. 4 is used to gate off all eight input clock signals when DPLL 150 is not going to be used. With all of the clock input signals gated off, the rest of the circuitry shown in FIG. 4 is not able to do any work and therefore consumes little or no power.

From the foregoing discussion, it will be apparent that after a suitable period of operation, the output signal of DPLL 150 will have substantially the same phase and frequency as the clock signal embedded in the CDR data received via driver 44 in FIG. 1. The correct frequency is established by PLL 100, which also produces a family of clock signals having that frequency and several different candidate phases. DPLL 150 picks the best candidate phases (the output signals of multiplexer circuitry 170) and then further refines the phase selection by making an appropriate adjustment or selection between the candidates. DPLL 150 can also take care of possible, relatively small differences in frequency between the PLL outputs and the clock information embedded in the incoming CDR data signal. In other words, DPLL 150 makes it possible for such relatively small frequency differences to exist without interfering with satisfactory CDR data transmission. This capability helps facilitate use of embodiments like that shown in FIG. 1A in which different sources 22 and 22' are used for the actual CDR clock and the REFCLK signals.

Figure 5:
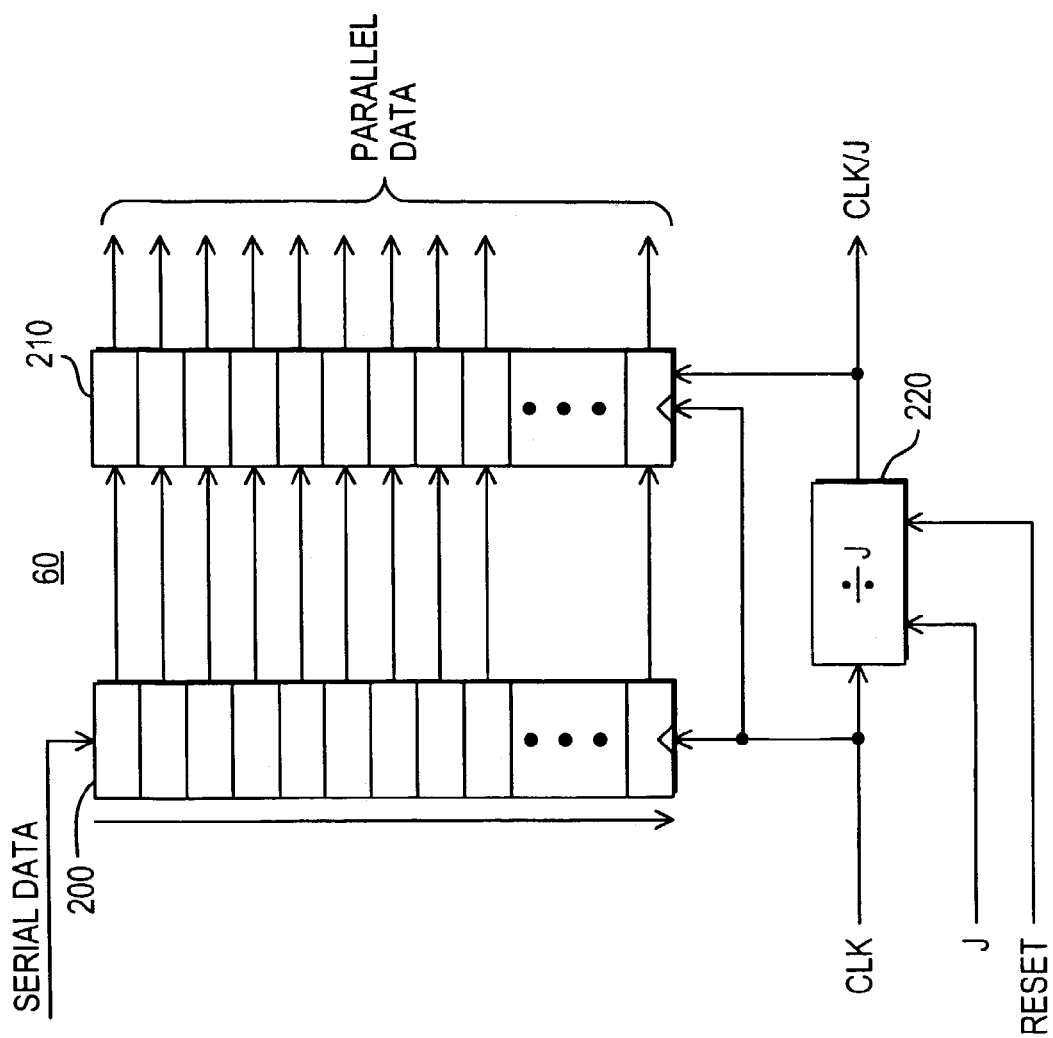
FIG. 5 is a more detailed, but still simplified, block diagram of an illustrative embodiment of still another portion of the FIG. 1 apparatus in accordance with the invention.

An illustrative embodiment of deserializer 60 (FIG. 1) is shown in more detail in FIG. 5. In this embodiment deserializer 60 includes a multi-stage shift register 200, a multi-stage parallel buffer register 210, and programmable divider 220. For example, each of registers 200 and 210 may have 20 stages and divider 220 may be programmable (using one or more FCEs) to divide the applied clock signal by any of several selectable values of J from 1 to 20. The serial, retimed, CDR data from DPLL 150 (FIG. 4) is applied to the serial data input of shift register 200. Shift register 200 also receives the recovered CLK output of DPLL 150. Accordingly, shift register 200 shifts the serial CDR data into its several stages at the EMBCLK rate and in substantially perfect synchronism with the clock signal information embedded in the CDR signal.

Each time divider 220 has received the number of clock pulses equal to the value of J, the output signal of divider 220 switches to a level which enables buffer register 210 to respond to a clock signal by storing the contents of the horizontally adjacent stages of shift register 200. In other words, shift register 200 stores data serially, and buffer register 210 periodically receives and stores the contents of shift register 200 in parallel. J is the length of each word (i.e., the number of bits per word) output in parallel by deserializer 60. Another output signal of deserializer 60 is a clock signal divided by J (i.e., the CLK/J signal).

The J and reset signals shown in FIG. 5 may come from PLD core 80 (FIG. 1). Like other reset signals described above, the reset signal in FIG. 5 is used to reset divider 220 when it is necessary or desirable reset the circuitry (e.g., due to detection of a loss-of-lock condition).

Figure 6:
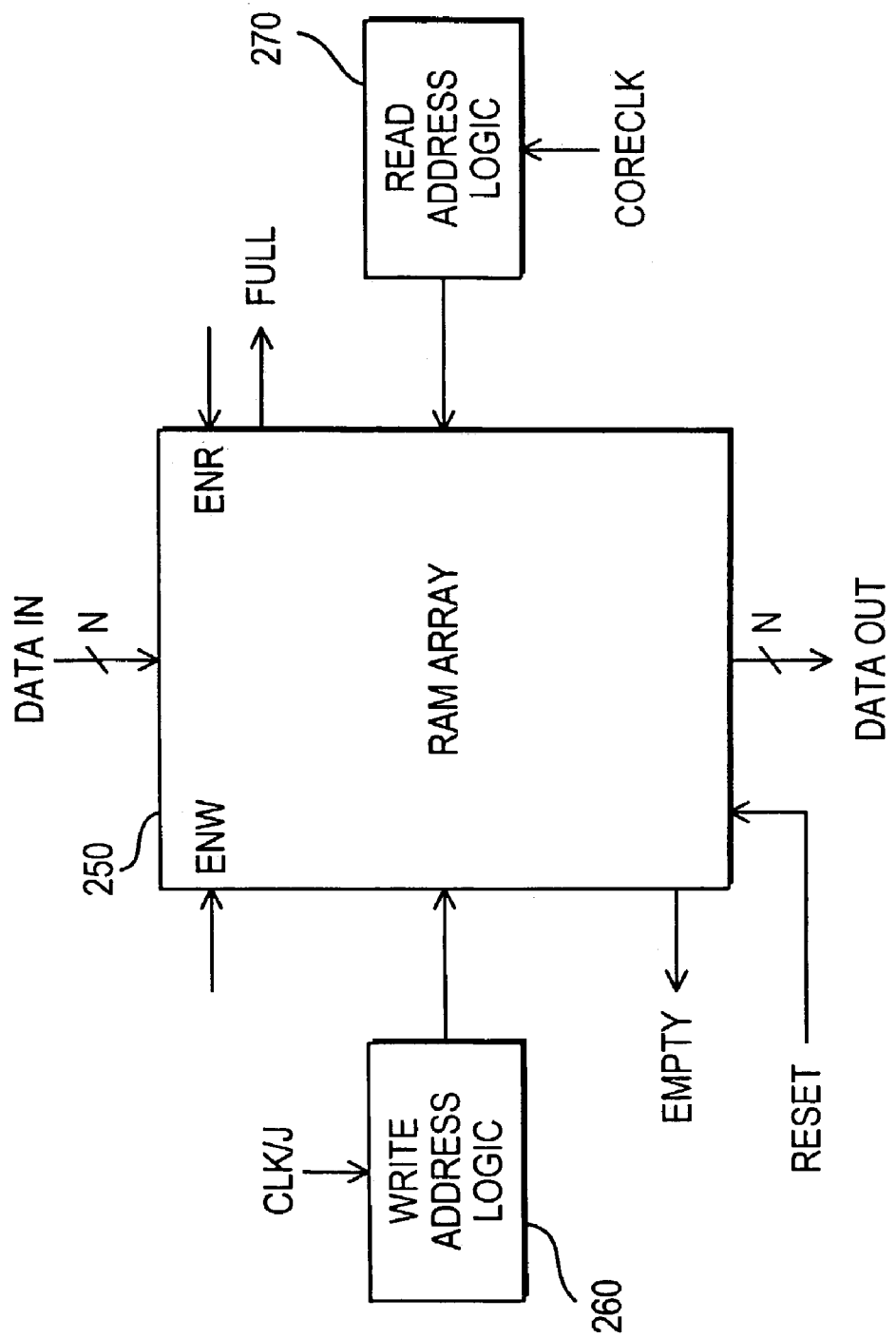
FIG. 6 is a more detailed, but still simplified, block diagram of an illustrative embodiment of yet another portion of the FIG. 1 apparatus in accordance with the invention.

An illustrative embodiment of synchronizer 70 (FIG. 1) is shown in more detail in FIG. 6. In this embodiment synchronizer 70 includes RAM array 250, write address logic 260, and read address logic 270. These elements operate as a first-in/first-out ("FIFO") memory with independent reads and writes. Write address logic 260 may be basically a ring counter which counts (in a repeating cycle) the pulses in the CLK/J signal output by deserializer 60 (FIG. 5). Accordingly, write address logic 260 addresses successive word storage locations in RAM array 250 in a repeating cycle in synchronism with pulses in the CLK/J signal. Assuming that the ENW signal has an appropriate level, RAM array 250 is enabled to receive and store data in signals from deserializer 60. In this way, successive parallel data words available from deserializer 60 are stored in successive word storage locations in RAM array 250. As has been said, writing into RAM array 250 is selectively enabled by the ENW signal, which may come from PLD core 80 (FIG. 1), and which may be enabling as long as RAM array 250 is not producing a full output signal (described below).

Read address logic 270 may be basically another ring counter like write address logic 260. Instead of counting clock pulses from deserializer 60, however, read address logic 270 counts clock pulses (CORECLK) produced by PLD core 80 (FIG. 1). Accordingly, read address logic 260 causes data words to be read from successive locations in RAM array 250 (which locations are addressed in a repeating cycle in synchronism with the CORECLK signal) as long as such reading is enabled by the ENR signal. Like the ENW signal, the ENR signal typically comes from PLD core 80 (FIG. 1), and is typically enabling as long as RAM array 250 is not producing an empty output signal (described below). The data words read from RAM array 250 are applied to PLD core 80.

From the foregoing, it will be apparent that RAM array 250 and its associated elements can operate to buffer data between two possibly different clock regimes (i.e., the CDR clock and a PLD core clock). For example, PLD core processing of data words can sometimes fall behind the incoming CDR data stream (e.g., during an interruption or slow-down in the CORECLK signal applied to synchronizer 70). Then the PLD can process data faster again to catch up to the incoming CDR data stream. RAM array 250 (or associated elements) may produce full and empty signals applied to PLD core 80 to tell the PLD core when the RAM array is approaching full or empty conditions, respectively. For example, in response to a full signal, PLD core 80 may speed up reading data from synchronizer 70 and/or the user may choose to have PLD core 80 respond to the full signal by using the ENW signal to stop further writing into RAM array 250. In response to an empty signal PLD core 80 may slow down reading data from synchronizer 70 and/or the user may choose to have PLD core 80 respond to the empty signal by using the ENR signal to stop further reading from RAM array 250.

The reset signal shown in FIG. 6 may be used to erase the contents of RAM array 250 whenever it is necessary or desirable to reset the circuitry (e.g., in response to detection of a loss-of-lock condition). Like the other reset signals described above, the reset signal in FIG. 6 may come from PLD core 80 (FIG. 1).

Figure 7:
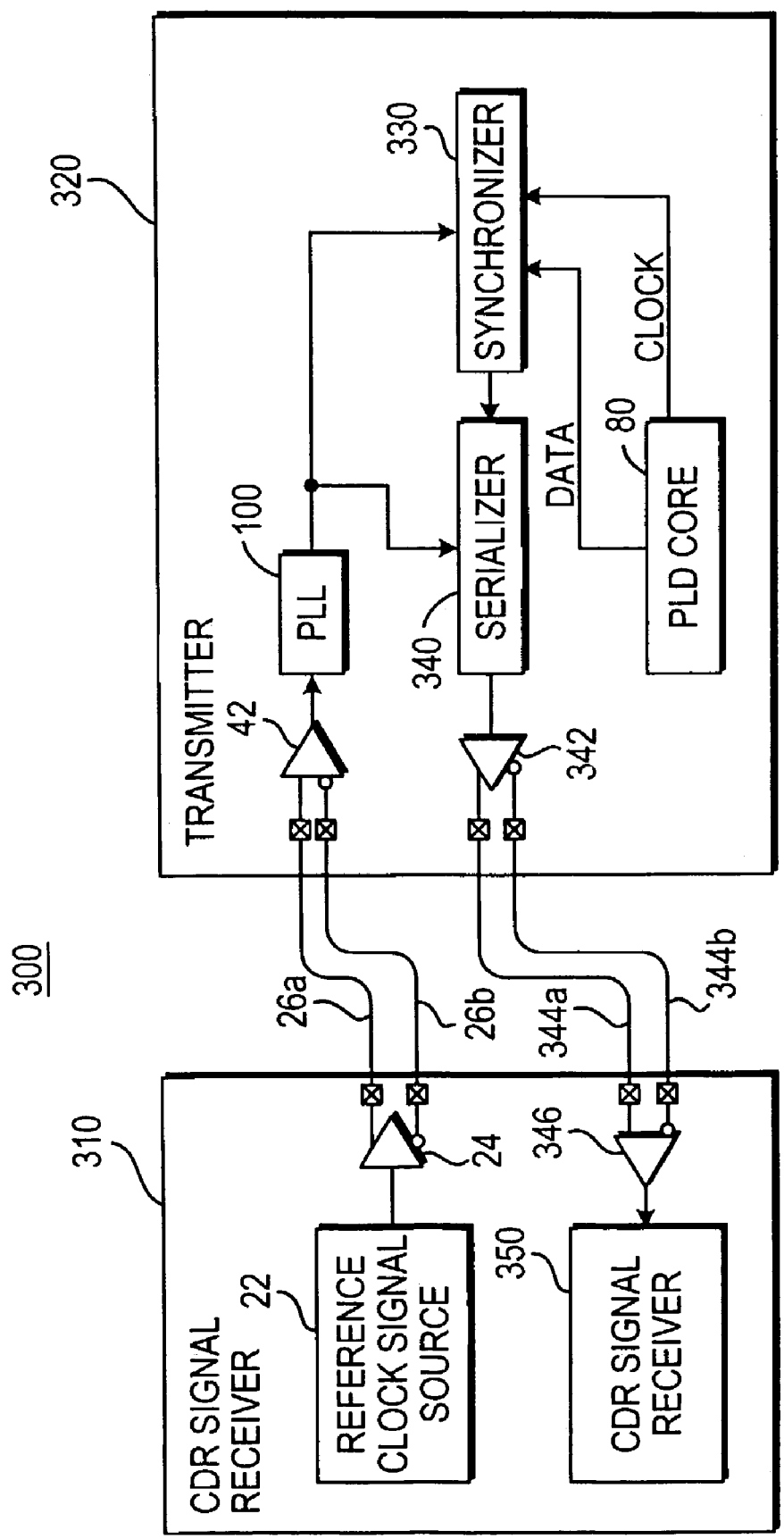
FIG. 7 is a simplified schematic block diagram of another illustrative embodiment of CDR signaling apparatus in accordance with the invention.
Figure 12:
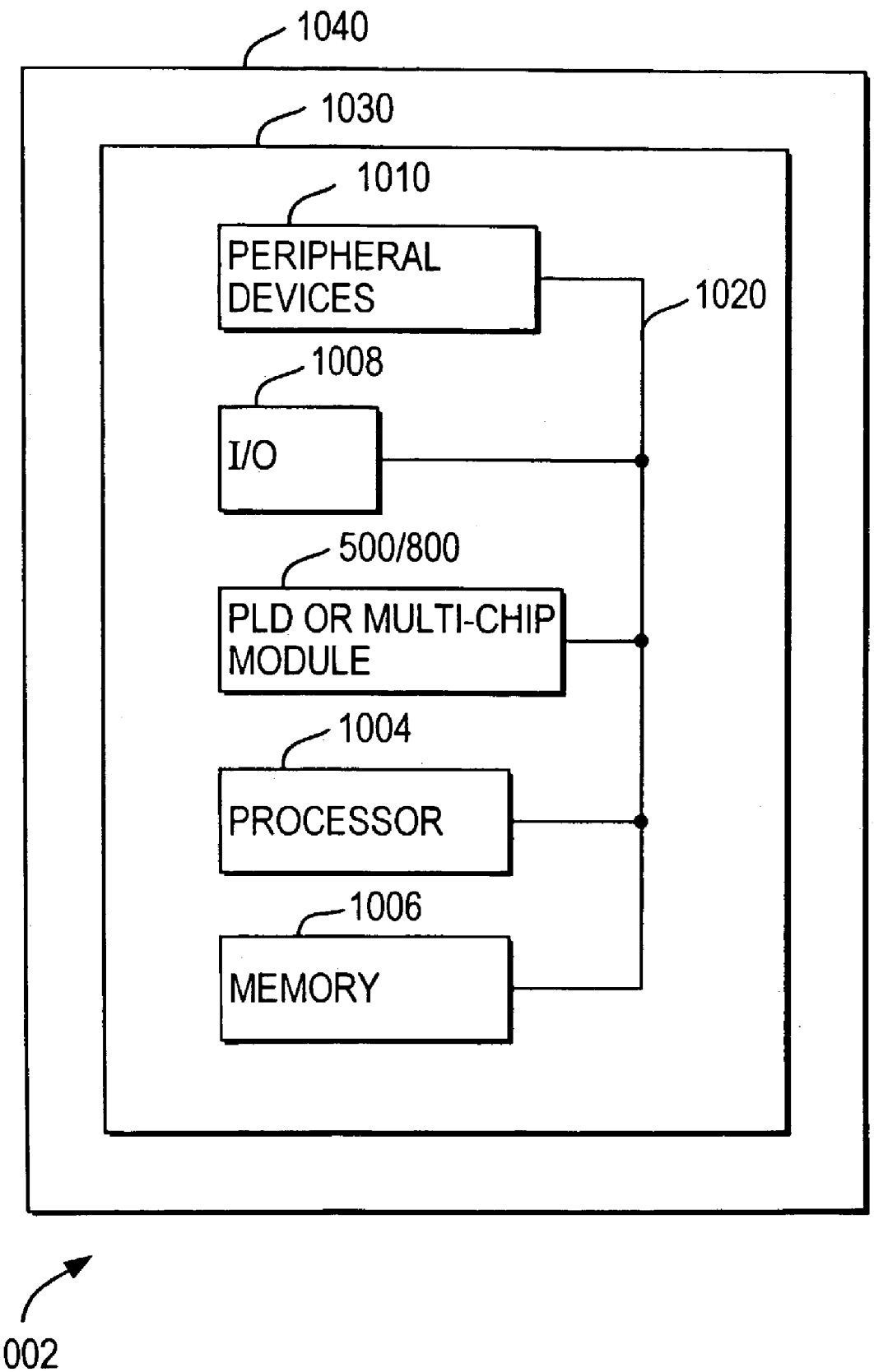
FIG. 12 is a simplified block diagram of an illustrative system employing circuitry in accordance with the invention.

FIG. 7 shows an illustrative embodiment of alternative CDR signaling apparatus 300 in accordance with the invention. Once again, although the major components 310 and 320 could be provided on the same integrated circuit, they are more typically portions of separate integrated circuits or circuit assemblies. In FIG. 12, for example, component 320 could be associated with elements 500/600, while component 310 could be associated with any other element(s) 1004, 1006, 1008, and/or 1010.

In apparatus 10, PLD core 80 is associated with the receiver 40 of the CDR signal. In apparatus 300, PLD core 80 is associated with the transmitter 320 of the CDR signal. Once again, to facilitate providing a programmable, PLD-based transmitter which can communicate with CDR receivers 310 having a wide range of expectations regarding the frequency of the CDR clock signal, apparatus 300 includes a reference clock signal source 22 in receiver 310. Elements 22, 24, 26, 42, and 100 may all be similar to the correspondingly numbered elements in FIGS. 1 and 2. Accordingly, the output signal of reference clock signal source 22 has frequency (REFCLK) related to the desired CDR clock signal frequency (EMBCLK) by the relationship given earlier, namely,

REFCLK★W=EMBCLK, where again W is a convenient scale factor such as 0.5, 1, 2, 4, etc. This reference clock signal is transmitted to transmitter 320 as described above in connection with FIG. 1. PLL 100 in transmitter 320 processes this signal as described above in connection with FIG. 2 to produce an output signal having a frequency which is precisely equal to the desired CDR clock frequency. This signal can be any one of the eight clock signals shown as outputs in FIG. 2 because the phase of this signal does not matter. (Conventional CDR signal receiver 350, described in more detail below, is phase-generic and therefore not dependent on the received CDR signal having any particular phase.)

The CDR clock signal produced by PLL 100 (or some multiple of that signal as described in more detail below) is applied to synchronizer 330 and serializer 340. Synchronizer 330 also receives data and clock signals from PLD core 80. Synchronizer 330 uses the signals it receives to output the data from core 80 in synchronism with the CDR clock signal. Serializer 340 converts typically parallel data from synchronizer 330 to typically serial CDR data. The serial CDR data output by serializer 340 is transmitted to CDR signal receiver 350 via conventional differential driver 342, leads 344a and 344b, and conventional differential driver 346. (Elements 342, 344, and 346 may be respectively similar to elements 24, 26, and 42 in FIG. 1. Also as in FIG. 1 the use of differential signaling for the CDR data is optional.) Conventional CDR signal receiver 350 uses the clock information embedded in the received CDR signal to extract the data from that signal in the conventional way.

Like the apparatus shown in FIG. 1, the apparatus shown in FIG. 7 can be constructed to operate at any one of a wide range of CDR frequencies. Although not conventional for CDR signaling, the use of reference clock signal source 22 in receiver 310 to supply a reference clock signal to transmitter 320 facilitates providing generic transmitter apparatus that is programmable to support such a wide range of CDR frequencies.

Figure 7A:
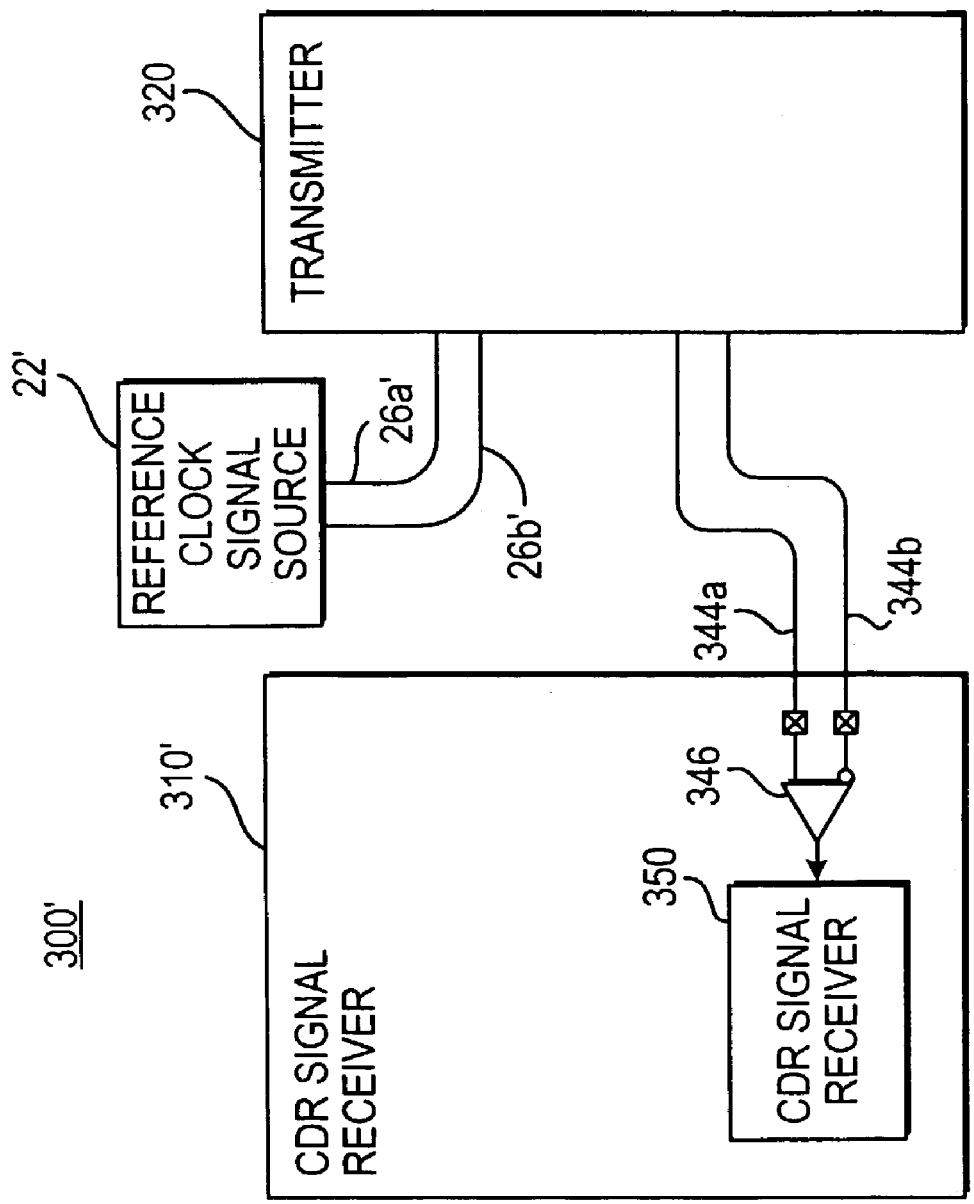
FIG. 7A is a simplified schematic block diagram of yet another illustrative embodiment of CDR signaling apparatus in accordance with the invention.

FIG. 7A shows an alternative embodiment of circuitry of the type shown in FIG. 7. The relationship between the FIG. 7 and FIG. 7A embodiments is similar to the relationship between the FIG. 1 and FIG. 1A embodiments. Thus FIG. 7A shows that reference clock signal source 22' can be separate from receiver 310'. (In other respects source 22' can be similar to source 22.) As in the case of FIG. 1A, providing a separate source 22', which can be close to transmitter 320, facilitates locating elements 310' and 320 relatively far from one another because only the CDR data signal (and not also the REFCLK signal) must be transmitted across the relatively great distance between elements 310' and 320.

Figure 8:
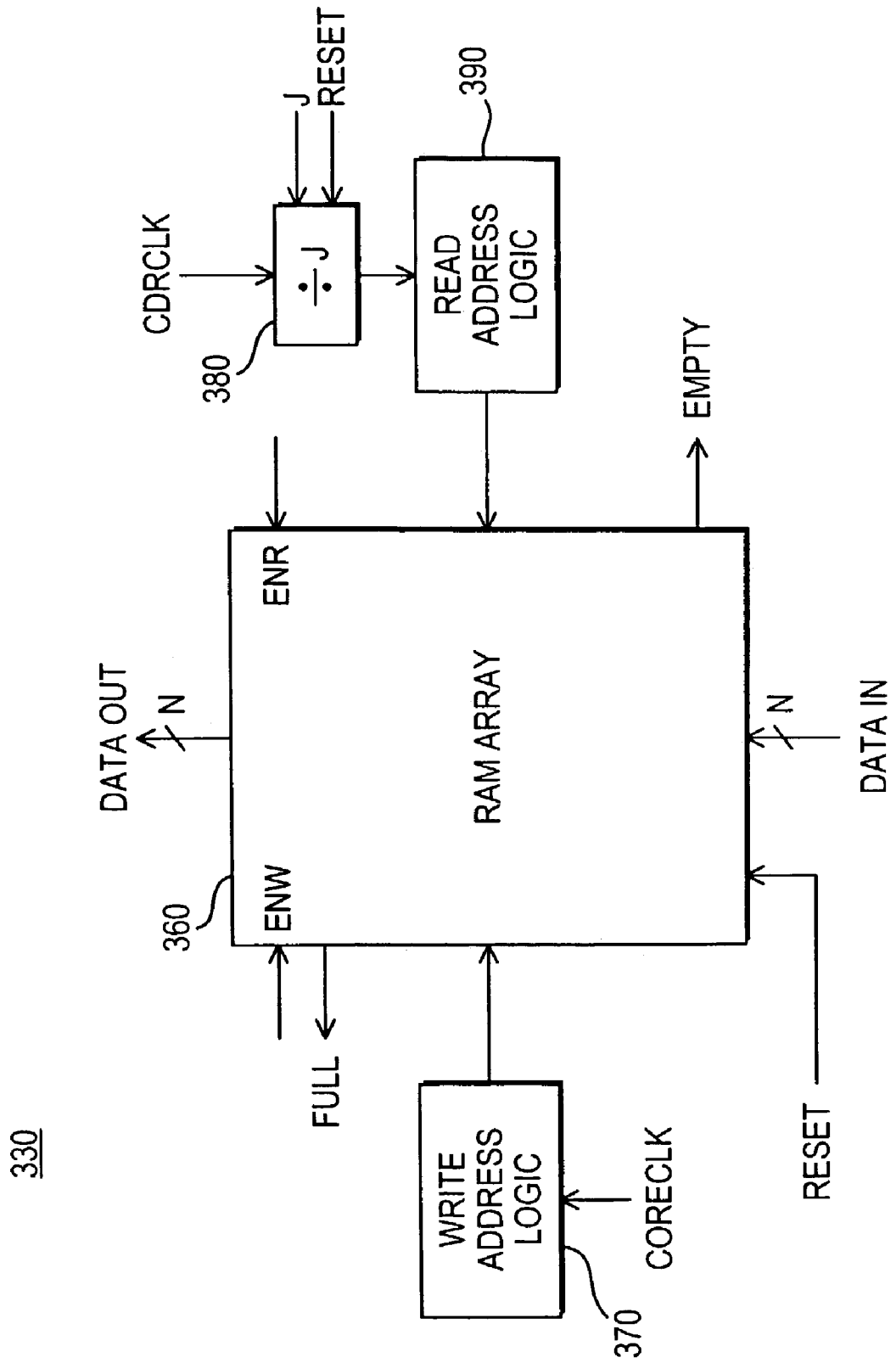
FIG. 8 is a more detailed, but still simplified, block diagram of an illustrative embodiment of a portion of the FIG. 7 apparatus in accordance with the invention.

An illustrative embodiment of synchronizer 330 is shown in more detail in FIG. 8. In this embodiment synchronizer 330 includes RAM array 360, write address logic 370, clock divider 380, and read address logic 390. RAM array 360 receives parallel data words from PLD core 80 (FIG. 7) in synchronism with a CORECLK signal supplied by core 80 to write address logic 370. Write address logic 370 may be similar to write address logic 260 in FIG. 6 and therefore addresses successive data word storage locations in RAM array 360 in a repeating cycle. Accordingly, successive data words supplied by PLD core 80 are stored in successive locations in RAM array 360 in a repeating cycle in synchronism with the CORECLK signal as long as writing is enabled by an ENW signal also supplied by core 80. Core 80 typically supplies a write-enabling ENW signal as long as RAM array 360 is not producing a full signal.

Clock signal frequency divider 380 divides the CDRCLK signal output by PLL 100 (FIG. 7) by J. The value of J is preferably a programmable parameter of the apparatus (e.g., stored in one or more FCEs). As in the earlier discussion of FIG. 5, J is an integer number equal to the number of bits in each parallel data word received by the FIG. 8 apparatus from PLD core 80 (FIG. 7). The output signal of divider 380 is applied to read address logic 390. Logic 390 may be similar to read address logic 270 in FIG. 6. Accordingly, logic 390 addresses successive word storage locations in RAM array 360 in a repeating cycle for reading data words from those locations in synchronism with the output signal of divider 380 as long as reading is enabled by an ENR signal also supplied by core 80. Core 80 typically supplies a read-enabling ENR signal as long as RAM array 360 is not producing an empty signal. Data read from RAM array 360 is applied in parallel to serializer 340 (FIG. 7).

From the foregoing it will be seen that synchronizer 330 (like synchronizer 70 in FIG. 6) operates like a FIFO memory to buffer data between two possibly different clock regimes. In this case the data being buffered is data from PLD core 80 which is on its way to serializer 340. As has already been alluded to, synchronizer 330 may produce full and empty signals to indicate to PLD core 80 when it is approaching a full or empty condition, respectively.

The reset signals shown in FIG. 8 may be used to erase the contents of RAM array 360 and reset divider 380 whenever it is necessary or desirable to reset the circuitry (e.g., in response to detection of a loss-of-lock condition). Like other reset signals mentioned herein, the reset signals in FIG. 8 may come from PLD core 80 (FIG. 7).

Figure 9:
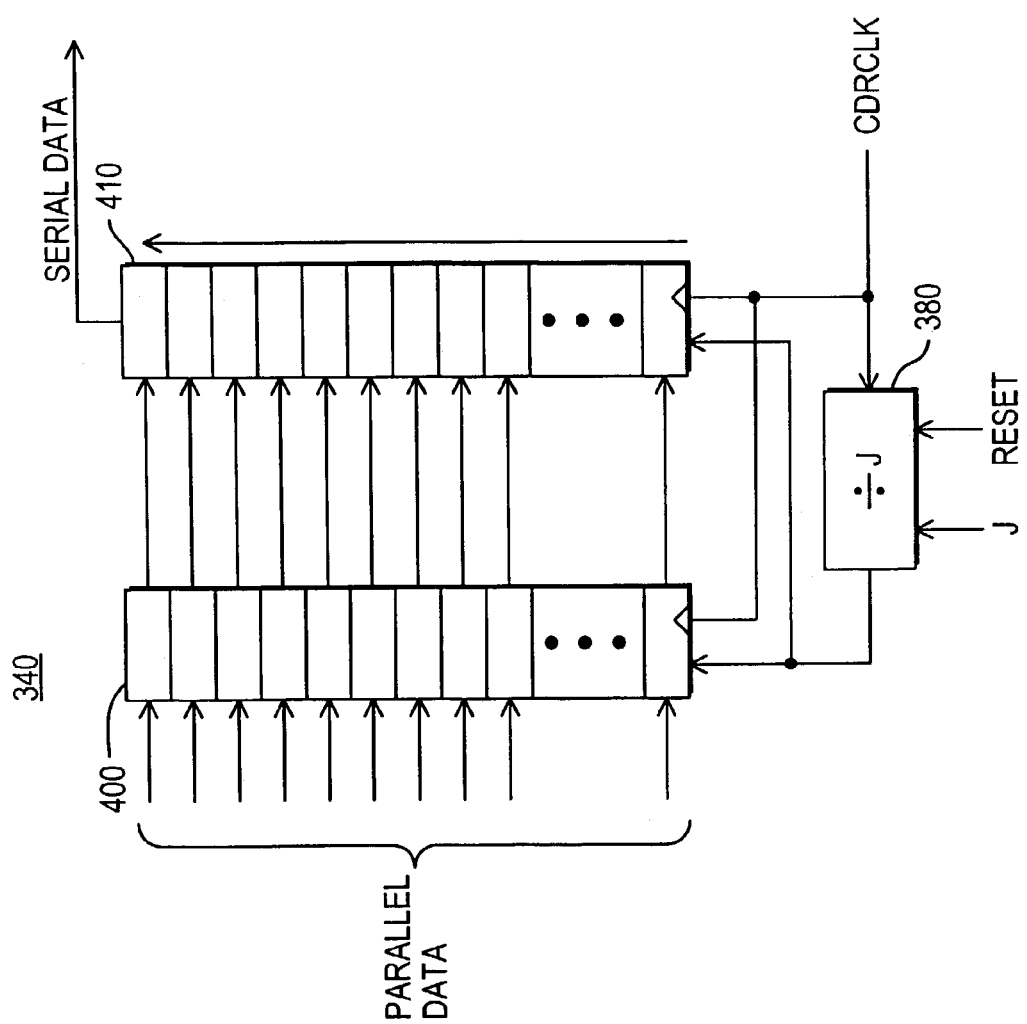
FIG. 9 is a more detailed, but still simplified, block diagram of an illustrative embodiment of still another portion of the FIG. 7 apparatus in accordance with the invention.

An illustrative embodiment of serializer 340 is shown in more detail in FIG. 9. In this embodiment serializer 340 includes parallel data register 400 and shift register 410. Clock frequency divider 380 from FIG. 8 is also used again. Parallel data from RAM array 360 is applied to register 400 and stored in that register in response to a CDRCLK signal pulse gated by the output signal of divider 380. (The CDRCLK signal shown in FIG. 9 can be the same as the similarly labeled signal in FIG. 8.) The data stored in register 400 is transferred in parallel to shift register 410 in response to a CDRCLK signal pulse when the output signal of divider 380 indicates to register 410 that it should receive data during that CDRCLK signal pulse. During all CDRCLK signal pulses shift register 410 shifts data toward its serial data output lead. In particular, shift register 410 shifts its contents one stage toward its serial data output lead in response to each CDRCLK pulse. Accordingly, serializer 340 converts each parallel data word of J bits to serial CDR output data synchronized with the CDRCLK signal. The resulting CDR data signal is applied to differential driver 342 for transmission to receiver 310 in the same way that the CDR data signal in FIG. 1 is transmitted from source 30 to receiver 40.

Figure 10:
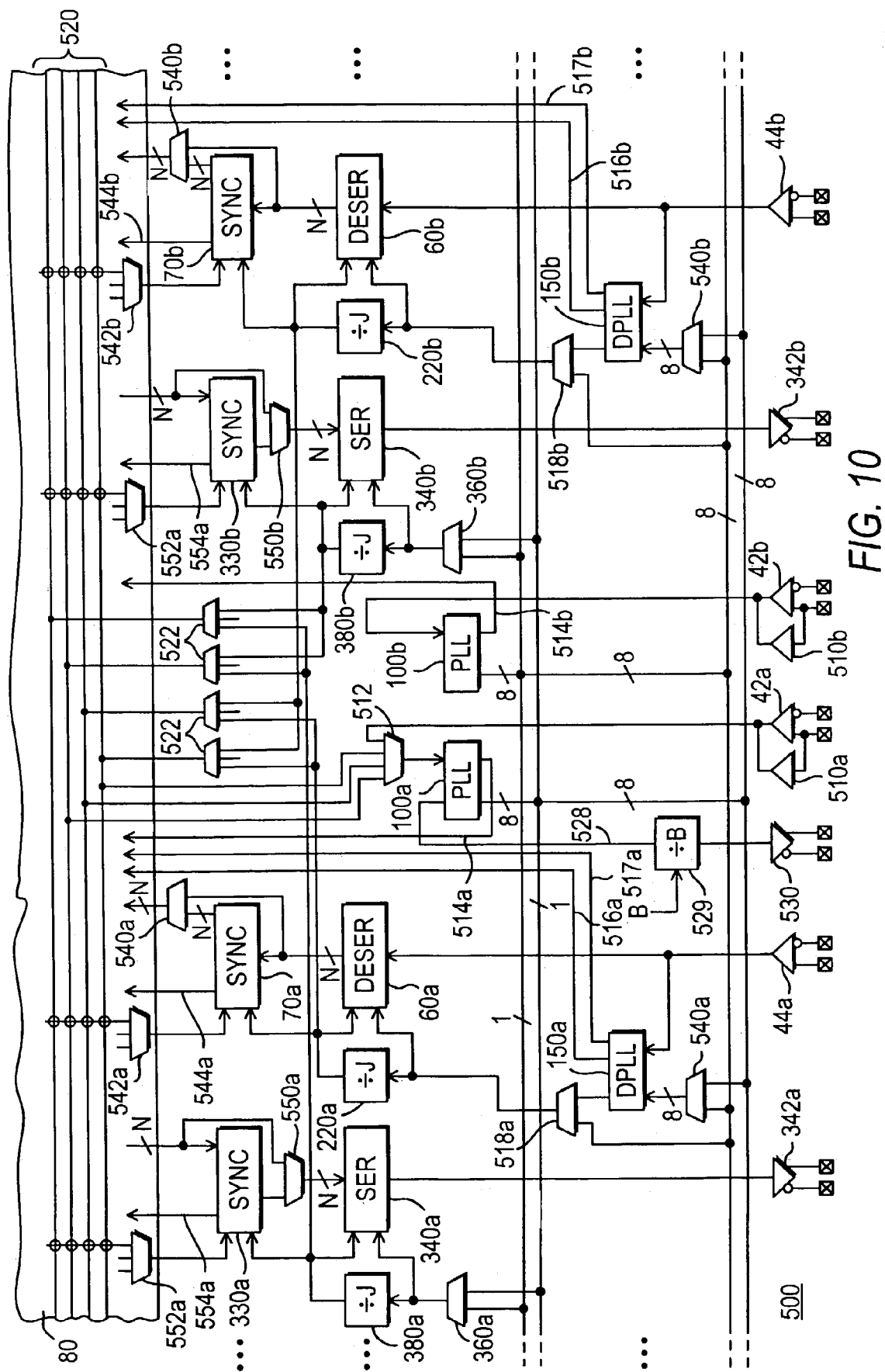
FIG. 10 is a simplified schematic block diagram of a representative portion of an illustrative embodiment of a programmable logic device which combines features from the earlier FIGS. and other features in accordance with the invention.

FIG. 10 shows a representative portion of an illustrative embodiment of a PLD 500 which includes all the features of above-described receiver 40 (FIG. 1) and transmitter 320 (FIG. 7), plus additional features that will be described below. Elements in FIG. 10 that are similar to previously described elements have the same reference numbers that have already been used for those elements. In FIG. 10 suffix letters "a" and "b" are added to facilitate unique reference to elements that occur more than once. Reference numbers in the 500 series are used in FIG. 10 for elements that were not specifically referenced in earlier FIGS. or that are added in FIG. 10 and therefore have no counterparts in earlier FIGS. Some elements are optionally modified or added in FIG. 10 to support signaling modes that are alternative to the illustrative CDR signaling mode discussed in connection with the earlier FIGS. For example, the reference clock signal supplied in FIG. 1 or FIG. 7 does not have to be a differential signal, but can instead be a single-ended signal. FIG. 10 shows apparatus for supporting that alternative. As another example, FIG. 10 shows apparatus for supporting non-CDR low voltage differential signaling ("LVDS"). (For additional background regarding non-CDR LVDS (referred to hereinafter as LVDS) see, for example, Nguyen et al. U.S. Pat. No. 6,236,231.)

It should be noted that to avoid over-crowding the drawing, FIG. 10 does not repeat all the circuitry shown in some of the earlier FIGS. For example, FIG. 10 does not show again the various reset and power down signals that are shown in some of the earlier FIGS. Nor does FIG. 10 show the ENW and ENR signals shown in certain earlier FIGS. It will be understood, however, that these signals are preferably present in the FIG. 10 circuitry.

Considering first the input aspects, FIG. 10 shows two representative input clock subcircuits (e.g., for the reference clock signals used in connection with CDR signaling or, in the case of PLL 100*b* and associated circuitry, for alternatively receiving an LVDS clock signal). FIG. 10 also shows two representative data input subcircuits (e.g., for receiving CDR or LVDS signals). It will be understood that these various subcircuits can be used wholly or partly independently of one another or together in any of a wide range of combinations. For example, some subcircuits can be used for CDR signaling while other subcircuits are used for LVDS. It will also be understood that device 500 may include more of any or all of these various kinds of subcircuits.

A typical clock input subcircuit includes elements 42*a*, 510*a*, 512, and 100*a*. Element 510*a* is a simple (i.e., non-differential) driver which can be programmably selected instead of differential driver 42*a* when the incoming clock signal (e.g., a CDR reference clock signal) is single-ended rather than differential. Programmable logic connector ("PLC") 512 allows programmable selection of the clock signal applied to PLL 100*a* from among the output signal of drivers 42*a*/510*a* and the clock signals on any of several global clock signal conductors 520 in PLD core 80. One of these global clock signals may be selected when PLL 100*a* is being used, for example, to produce a clock signal for LVDS transmission. When used for that purpose, the clock signal produced by PLL 100*a* is output via LVDS differential driver 530. Transmission (including LVDS transmission) is discussed more extensively later in this specification. PLL 100*b* does not have an associated PLC 512 because PLL 100*b* is not usable for LVDS transmission. PLL 100*b* is, however, used for the clock signal that must accompany LVDS input. When used for CDR signaling as described earlier in this specification, PLL 100*a* receives the output signal of driver 42*a* or 510*a*, and outputs eight phase-shifted candidate CDR clock signals. A similar group of eight signals can be output by PLL 100*b*.

In FIG. 10 each PLL 100 may have a further output signal which is not shown in the earlier FIGS. This is a "loss of lock" signal on the lead 514 associated with each PLL. The loss of lock signal is a flag indicating whether or not the associated PLL has locked onto the applied clock signal. The loss of lock signal value indicating a locked condition can be produced, for example, after the output signal of PFD 110 (FIG. 2) has been of relatively low magnitude for a predetermined time interval. Otherwise the loss of lock signal is produced with a value indicating that lock has been lost. The signals on leads 514 are applied to PLD core 80 for any desired use by the programmable logic of the core. For example, core 80 may be programmed to ignore data received from any subcircuit(s) for which loss of lock is currently being indicated and/or to produce the above-described reset signals for such subcircuit(s).

Each DPLL 150 has an associated PLC 540 for allowing selection of either of the two groups of eight signals output by PLLs 100*a* and 100*b* for application to that DPLL. Thus each DPLL 150 can be used with either of PLLs 100. Each DPLL 150 has an associated input differential driver 44 (e.g., for receiving a CDR signal). Each DPLL 150 processes the applied CDR signal and candidate CDR clock signals to produce a final CDR clock signal which is applied to associated elements 60 and 220 as described earlier in this specification. Each DPLL 150 also produces a retimed CDR data signal which is applied to associated element 60 (although to avoid over-crowding FIG. 10 this is represented simply as a direct connection from the CDR data input driver 44 to the associated element 60). (It should be noted here that DPLLs 150 are not used at all for LVDS signaling. For this purpose each DPLL 150 has an associated PLC 518 for allowing a selected one of the eight output signals of PLL 100*b* to bypass that DPLL and to be applied to the elements 60 and 220 associated with that DPLL. Incoming LVDS data passes directly from an input driver 44 to the associated deserializer 60 without the associated DPLL 150 being used.)

As shown in FIG. 10, each DPLL 150 may also have two other output signals not previously described. These are a "run length violation" flag signal on the lead 516 associated with each DPLL and a "digital loss of lock" signal on the lead 517 associated with each DPLL. The run length violation signal has a value indicating a run length violation whenever the associated DPLL 150 detects that more than a permitted number of CDR clock signal cycles has passed without a transition in the level of the applied CDR signal. Such a run length violation signal may be produced by a counter/comparator circuit in each DPLL 150. The counter counts each CDR clock pulse, but is reset by each transition in the CDR signal. The comparator compares the count in the counter to a predetermined (preferably programmable) value indicative of the acceptable number of CDR clock signal cycles or pulses which can occur between transitions in a valid CDR signal. Whenever the comparator indicates that the counter count exceeds the acceptable number, the value of the run length violation signal is made to indicate that a run length violation has occurred.

Figure 10A:
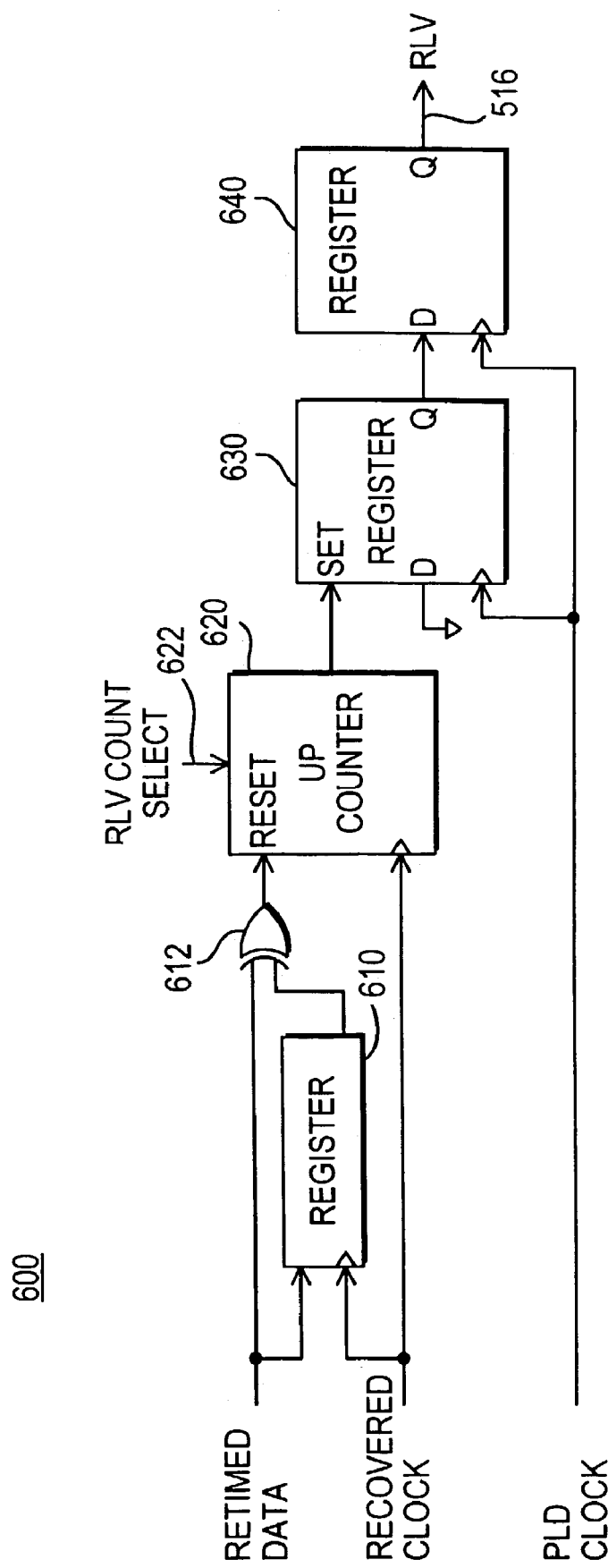
FIG. 10A is a simplified schematic block diagram of an illustrative embodiment of circuitry that may be included in the FIG. 10 circuitry in accordance with the invention.

FIG. 10A shows an illustrative embodiment of circuitry 600 that can be used to produce RLV signal 516. Up counter 620 in this circuitry counts recovered clock signal pulses (see FIG. 4 for source), but is reset to zero each time the output signal of EXCLUSIVE OR ("XOR") gate 612 goes high. XOR gate 612 receives the retimed data signal (see again FIG. 4 for source) via one of its inputs, and receives the output of register 610 via the other of its inputs. Register 610 is clocked by the recovered clock signal to register the retimed data signal. The output of XOR gate 612 will go high whenever one (but not both) of the inputs to that gate is high. Whenever the retimed data signal has a rising edge, the output signal of XOR gate 612 will go high (thereby resetting counter 620) because register 610 will still be outputting the previous low level of the retimed data signal. Thereafter, the output of register 610 will go high, and if the retimed data signal has not had a falling edge, the output signal of XOR gate will go low, allowing counter 620 to begin counting. If this condition (i.e., no falling edge in the retimed data signal) persists for too many recovered clock signal cycles, counter 620 will reach the threshold count applied to it via leads 622. The threshold count parameter is preferably programmable (e.g., using FCEs). As soon as the threshold count is reached, counter 620 outputs a signal which sets register 630, thereby immediately changing the output signal of register 630 to logic 1. On the next PLD clock signal (from PLD core 80 (FIG. 10)) register 640 registers the high output signal of register 630 and thereby produces RLV output signal 516 indicating that a run length violation has occurred. Register 630 returns to outputting logic 0 in response to any PLD clock signal pulse after the set signal from counter 620 has been removed. Circuitry 600 responds in the same general way to any falling edge in the retimed data signal which is not followed sufficiently soon by a rising edge in that signal. However, if rising and falling edges in the retimed data signal are sufficiently close together in time, counter 622 is reset frequently enough so that the threshold count is never reached and no RLV flag signal 516 is produced.

Although RLV detection could be alternatively provided in PLD core 80, including it in the CDR circuitry as shown herein may be advantageous because it conserves PLD core circuitry for other uses. It may also make the RLV flag signal 516 available earlier than it can be made available using PLD core 80 for RLV detection. RLV detection circuitry like circuitry 600 makes use of the high-speed, recovered, CDR clock, which speeds the detection of an RLV condition.

Returning to FIG. 10, the digital loss of lock signal 517 may be produced by a DPLL 150 under conditions similar to a PLL 100 producing a loss of lock signal 514, as described earlier in this specification. For example, the digital loss of lock signal may be produced by a DPLL 150 until that DPLL has been relatively stable for a predetermined period of time. The required period of stability is preferably programmable (e.g., via FCEs) to facilitate using circuitry 500 with any of a wide range of DPLL frequencies.

Figure 10B:
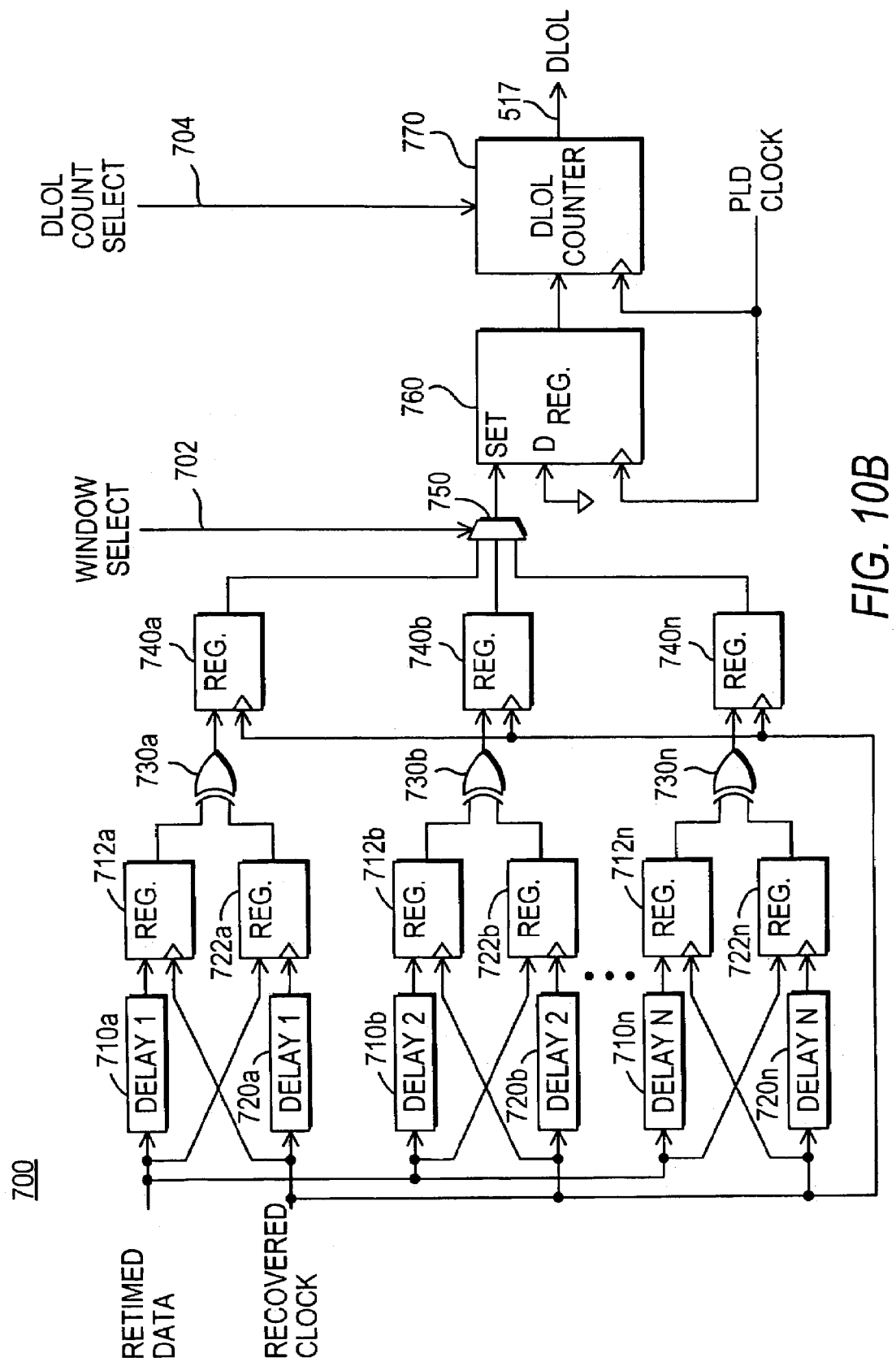
FIG. 10B is a simplified schematic block diagram of an illustrative embodiment of other circuitry that may be included in the FIG. 10 circuitry in accordance with the invention.

Illustrative circuitry 700 for producing digital loss of lock ("DLOL") signal 517 is shown in FIG. 10B. This circuitry allows any of several loss of lock time intervals or windows to be programmably selected (e.g., via FCEs supplying the multiplexer control signals on leads 702). Each group a-n of elements 710/712/720/722/730/740 provides a respective one of the available DLOL time windows. Each time window is basically implemented by the delay of the elements 710 and 720 in the group of elements associated with that time window. Considering representative group a, for example, delay element 710a passes the retimed data signal (see FIG. 4 for source) after a certain amount of time delay. Delay element 720a passes the recovered clock signal (see again FIG. 4 for source) after that same amount of time delay. Register 712a receives the output signal of delay element 710a as a data signal and is clocked by the recovered clock signal. Register 722a receives the retimed data signal as a data signal and is clocked by the output signal of delay element 720a. A rising edge in the recovered clock signal should be approximately centered in each retimed data interval. If it is thus properly timed, both of registers 712a and 722a will capture the data and the output signal of the associated XOR gate 730a will logic 0, thereby indicating that there is no loss of lock problem. On the other hand, if the retimed data pulse is sufficiently late that the delay of element 710a makes it too late for registration by register 712a, then the output signal of register 712a may be logic 0 while the output signal of register 722a is logic 1. This causes the output signal of XOR gate to be logic 1, which indicates a loss of lock condition. Similarly, if the retimed data pulse is too early relative to the recovered clock rising edge, the delay of element 720a will be sufficient to prevent register 722a from registering the data pulse. This may cause the output signal of register 722a to be logic 0 while the output signal of register 712a is logic 1. This will again cause the output signal of XOR gate 730a to be logic 1 to indicate a loss of lock problem.

Any logic 1 output signal produced by an XOR gate 730 is registered by the associated register 740 in response to the recovered clock signal. Multiplexer 750 is programmably controlled by the signals on leads 702 (described earlier) to output the signal of any desired one of registers 740. The output signal of multiplexer 750 is therefore an error signal based on the delay window associated with the group of elements that includes the selected register 740. Any logic 1 output signal of multiplexer 750 immediately sets register 760. The setting of register 760 is counted by DLOL counter 770 when the next PLD clock signal is received. Counter 770 will continue to count as long as or whenever register 760 is set. (Register 760 is effectively reset by any PLD clock pulse that occurs while register 760 is not receiving a set signal from multiplexer 750.) When counter 770 reaches a predetermined threshold count (supplied via leads 704 and preferably programmable (e.g., using FCEs)), counter 770 outputs a loss of lock flag signal via lead 517. Although not shown in FIG. 10B, counter 770 can be reset (e.g., by a signal from PLD core 80) whenever desired (e.g., after steps appropriate to detection of a loss of lock have been taken).

The various different delays available in FIG. 10B may be chosen to be appropriate for detecting loss of lock in any of several different CDR clock frequency ranges. Thus the ability to programmably select any of several delay windows in useful in enabling the circuitry of this invention to be used with any of a wide range of CDR clock frequencies. This feature can also be used to provide different programmably selectable degrees of tolerance for drift between CDR data and the recovered CDR clock. The sensitivity of the DLOL circuitry is also programmably selectable via the DLOL count select signals on leads 704.

Returning once again to FIG. 10, run length violation signals 516 and digital loss of lock signals 517 are applied to PLD core 80 for possible use by the programmable logic of the core. For example, core 80 may be programmed to suspend use of any incoming data from a subcircuit or subcircuits for which the run length violation signal 516 has a value indicating that a run length violation is currently being detected and/or to produce the above-described reset signals for such subcircuit(s). Similar action(s) may be taken in response to a digital loss of lock signal.

The data signal from each driver 44 (actually from the associated DPLL 150 in CDR mode) is also applied to an associated deserializer 60. Each deserializer 60 also receives two clock signals, one from the associated PLC 518 and the other from the associated divider 220. Each deserializer 60 uses the applied signals to convert the applied serial data to successive parallel words of J bits each. The data can be either CDR input data or another form of input data such as LVDS.

The output signals of dividers 220 (and also dividers 380) can also be applied to various ones of global clock signal conductors 520 via PLCs 522 if it is desired to have any of these divider signals available as clock signals within PLD core 80. Of course, the signals on clock signal conductors 520 may be alternatively selected from other sources such as a local oscillator, a clock input pin, or an output signal of logic elements in core 80.

The parallel data output by each deserializer 60 may be applied to the associated synchronizer 70 as described in connection with the earlier FIGS., or that data may bypass the synchronizer and be applied directly to PLD core 80 via the associated PLCs 540. The former routing is typically used for CDR signaling (although it can also be used for LVDS, if desired), in which case the synchronizer 70 uses clock signals from both the associated divider 220 and from PLD core 80 to convey data across the temporal interface between the CDR (or LVDS) clock regime and a PLD core clock regime. In particular, a PLC 542 allows selection of a core clock signal for each associated synchronizer 70 from any of several sources in PLD core 80 (e.g., from any of global clock signal conductors 520 or from other suitable sources within core 80). As has been said, the parallel data signals output by each synchronizer 70 are applied to PLD core 80 via the associated PLC 540 if the PLC is programmed to make that selection. As has also been said, each synchronizer 70 can be bypassed in order to apply the parallel outputs of the associated deserializer 60 directly to PLD core 80 if the associated PLC 540 is programmed to effect that signal routing. This may be done for CDR or LVDS input having the same clock as is used in PLD core 80.

Other output signals 544 of each synchronizer 70 (e.g., the above-mentioned full and empty signals) are also applied to PLD core 80 for possible use (e.g., by the programmable logic of the core). For example, PLD core 80 may use these signals to temporarily stop reading data from a synchronizer 70 that is currently producing an empty output signal. Alternatively or in addition, PLD core 80 may send a "stop" signal to a transmitter (e.g., like element 20 in FIG. 1) to stop the transmission of more data to a synchronizer 70 that is currently producing a full output signal.

Considering now the output aspects, FIG. 10 shows two representative data output subcircuits (e.g., for transmitting CDR or LVDS signals). Each such subcircuit begins with a synchronizer 330 which receives parallel data from PLD core 80. Alternatively, this data may bypass a synchronizer 330 via the associated PLC 550. This bypass routing may be used for LVDS, whereas the synchronizer route is generally used for CDR as described in connection with the earlier FIGS. Assuming routing via a synchronizer 330, the synchronizer also receives a core clock signal from an associated PLC 552. Each PLC 552 allows selection of the core clock signal from any of several possible sources such as any of global clock signal conductors 520, from logic elements in core 80, etc. Each synchronizer 330 also receives a CDR or LVDS clock signal (after division by J) from an associated divider 380. (Each divider 380 gets its CDR/LVDS clock signal from an associated PLC 360, which can select the CDR/LVDS clock signal to be used from one of the outputs of either of PLLs 100. (In the case of CDR, it is generally possible to use any of the eight outputs of the appropriate PLL 100. In the case of LVDS, it may be desirable to select an output of PLL 100*a* that will help to mitigate problems with skew.)) Accordingly, each synchronizer 330 can interface data between a PLD core clock regime and an external CDR or LVDS clock regime as described above in connection with the preceding FIGS.

The PLC 550 associated with each synchronizer 330 allows either the data output by the synchronizer or the data bypassing the synchronizer to be applied to the associated serializer 340. Other output signals of each synchronizer 330 (e.g., the earlier-described full and empty signals) may be applied to PLD core 80 via associated leads 554. PLD core 80 may use these signals in any desired way (e.g., similar to what is described above as possible uses for the full and empty output signals of synchronizer 70).

Each serializer 340 operates as described earlier to convert the parallel output signals of the associated PLC 550 to serial data which is applied to the associated output driver 342. To do this, each serializer 340 uses clock signals that are related to one another by a factor of J introduced by the associated divider 380. As mentioned earlier, the source of these signals is one of the output signals of either of PLLs 100. If a serializer 340 is processing a CDR signal, the clock signals applied to that serializer come from a PLL 100 that is operating on a CDR clock reference signal supplied to PLD 500 via one of drivers 42 or 510. In the case of PLL 100*a*, the CDR clock reference is selected for application to that PLL by PLC 512. On the other hand, if a serializer 340 is processing an LVDS signal, the clock signals applied to that serializer come from PLL 100*a*, which in this case is operating on a clock signal (sometimes referred to as an LVDS clock signal) from PLD core 80 (e.g., any of several leads 520) and selected by PLC 512. Because LVDS output signals typically include data and clock signals on separate leads, PLL 100*a* also outputs an LVDS clock signal via lead 528. This signal has an appropriate phase relationship to the signal on the output lead of PLL 100*a* that is applied to PLCs 360. After possible frequency adjustment by frequency divider 529, the LVDS clock signal on lead 528 is applied to differential driver 530, which converts the applied clock signal to two differential signals in accordance with LVDS standards for output from PLD 500. Thus PLD 500 may output both LVDS data signals via any one or more of drivers 342 and a synchronized LVDS clock signal via driver 530.

Frequency divider 529 is provided because some users may want an LVDS clock output signal having a frequency different from the frequencies used by the elements 100*a*, 330, and 340 involved in producing the associated LVDS data output signal. For example, the LVDS data may be supplied by PLD core 80 in 20-bit words at 42 MHz. To process such data, PLL 100*a* will have to output clock signals at 840 MHz (i.e., REFCLK in PLL 100*a* is 42 MHz and W in that PLL is 20). J in the associated LVDS data subcircuit will also be 20. However, the user may want a 420 MHz (not an 840 MHz) LVDS clock output signal from driver 530. Accordingly, frequency divider 529 is provided to allow the 840 MHz output signal on lead 528 to be divided by B (B=2 in the example being discussed), so that driver 520 will receive and output a 420 MHz LVDS clock signal. Divider 529 is preferably programmable with respect to B (e.g., using one or more FCEs), and B may therefore have any of several possible values. B may be supplied to frequency divider 529 by PLD core 80.

From the foregoing it will be seen that PLD 500 can be programmed to use its input and output subcircuits in various ways. For example, any of a wide range of combinations of CDR and/or LVDS input and/or output can be taking place simultaneously. If two CDR subcircuits are being used, those subcircuits can have the same or different clock frequencies. Also if two subcircuits are being used, both can be input, both can be output, or one can be input while the other is output. More replications of the data circuitry shown in FIG. 10 can be added so that each clock subcircuit can be used in combination with any desired number of data subcircuits. In order to support or facilitate LVDS or other signaling modes that do not require use of deserializers 60 and/or serializers 340, other routing may be provided which allows data signals to bypass those elements. In sum, it will be appreciated that just as the circuitry is programmable to support any of a wide range of CDR signaling protocols, it is similarly flexible with respect to a similarly wide range of non-CDR LVDS or other protocols.

Figure 10C:
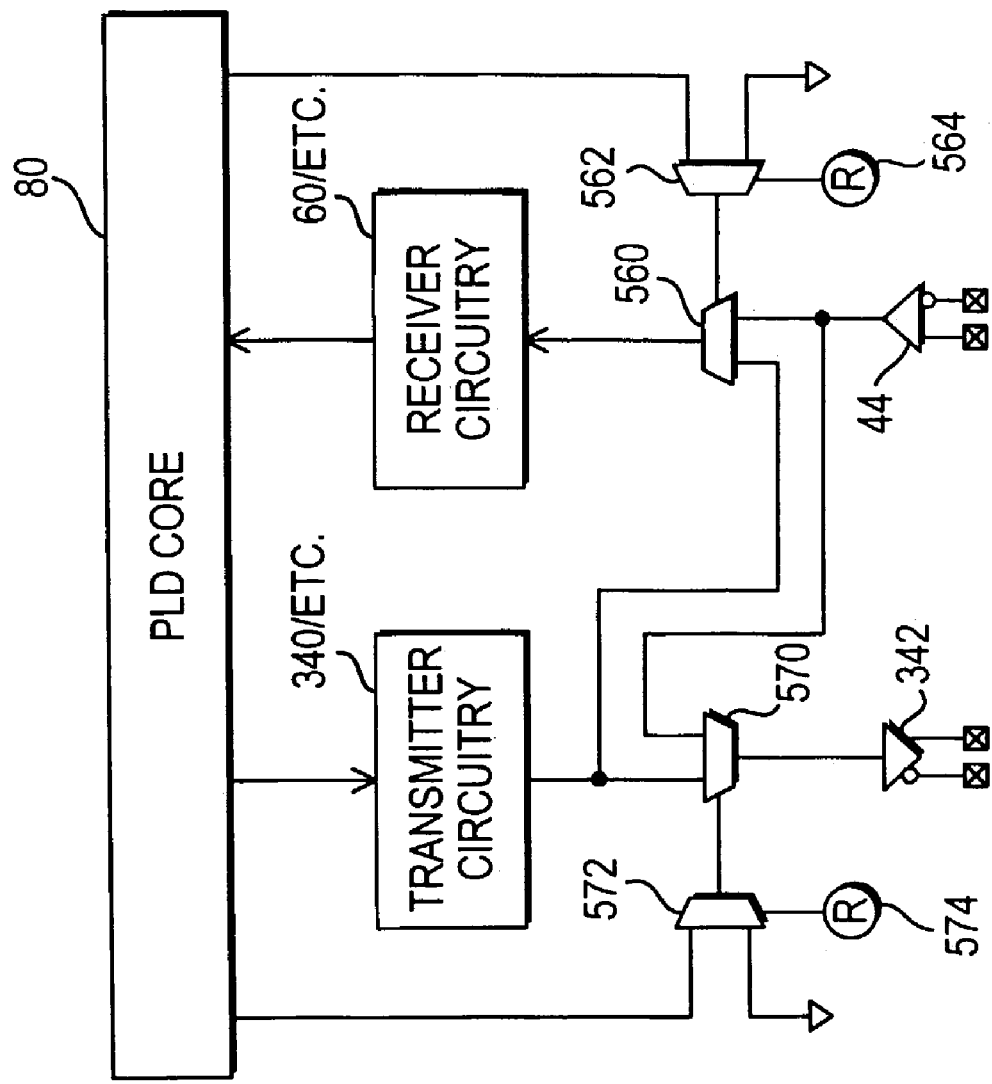
FIG. 10C is a simplified schematic block diagram showing an illustrative embodiment of possible modifications of representative portions of the FIG. 10 circuitry in accordance with the invention.

If desired, circuitry of the type shown in FIG. 10 may be augmented with additional circuitry as shown in FIG. 10C. Each data signal receiver subcircuit may include a PLC 560 connected in series between input driver 44 and the rest of receiver circuitry 60/ETC. (Although referred to for convenience herein as a programmable logic connector or PLC 560, element 560 may sometimes be dynamically controlled by PLD core 80. Nevertheless, the PLC terminology will continue to be used for convenience. The same is true for PLC 570, and it can also be true for other PLCs described elsewhere in this specification.) The other input to PLC 560 is the output of the transmitter circuitry 340/ETC. in an associated output data subcircuit. PLC 560 can select either of its inputs for application to receiver circuitry 60/ETC. PLC 560 is controlled to make this selection by the output signal of PLC 562. PLC 562 is programmably controlled by FCE 564 to apply either a fixed logic 0 signal or an output signal of PLD core 80 to the control input terminal of PLC 560. If fixed logic 0 is applied, then PLC 560 always applies the output signal of driver 44 to circuitry 60/ETC. If a PLD core 80 output signal is applied, that signal can be either logic 0 or logic 1, and the signal level can be different at different times during the operation of the apparatus. If the signal is logic 0, PLC 560 connects driver 44 to circuitry 60/ETC. If the signal is logic 1, PLC 560 connects the output of transmitter circuitry 340/ETC. to circuitry 60/ETC.

Elements 570, 572, and 574 operate similarly with respect to the output subcircuit shown in FIG. 10C. Thus PLC 570 can apply either the output of transmitter circuitry 340/ETC. or the output of input driver 44 to driver 342. PLC 570 is controlled to make this selection by the output of PLC 572. The output of PLC 572 can be either fixed logic 0 or an output signal of PLD core 80, depending on the programmed state of FCE 574. If the output of PLC 572 is logic 0 (either fixed or from PLD core 80), PLC 570 connects circuitry 340/ETC. to driver 342. On the other hand, if the output of PLC 572 is logic 1 (from PLD core 80), PLC 570 connects the output of input driver 44 to driver 342.

From the foregoing it will be seen that elements 560/570 and associated circuitry can be used to provide various different test loops. For example, element 560 can be controlled to route the output signal of transmitter circuitry 340/ETC. back to receiver circuitry 60/ETC. This routing can be used to allow PLD core 80 to transmit test data via circuitry 340/ETC. and to receive that data back via circuitry 60/ETC. If the test data comes back to PLD core 80 accurately, core 80 knows that circuitries 340/ETC. and 60/ETC. are operating properly. As another example, element 570 can be controlled to route test data received via driver 44 back out via driver 342. This is a convenient way to check the proper operation of drivers 44 and 342. Of course, another possible test mode is to pass test data received via driver 44 through elements 560, 60/ETC., 80, 340/ETC., and 570 and back out through driver 342. Normal (i.e., non-test mode) routing has PLC 560 connecting driver 44 to circuitry 60/ETC., and PLC 570 connecting circuitry 340/ETC. to driver 342.

The various condition-monitoring signals (e.g., the loss of lock and run length violation signals)—as well as various operation checks that the user may program into PLD core 80—and the various reset signals described throughout this specification can be used by PLD core 80 to automatically reset various portions of circuitry 500 under various conditions. Two examples of such possible reset modalities are referred to herein as "global reset" and "channel reset." Global reset resets all PLLs 100, all DPLLs 150, all counters (refers to counters/dividers/multipliers in PLLs, DPLLS, serializers, and deserializers), and all FIFOs (i.e., the RAM arrays 250 and 360). Channel reset resets the FIFOs in the pair of receiver and transmitter subcircuits that are associated with one another or paired to produce the channel being reset. Channel reset also resets the DPLL 150 in the channel being reset. The actual components reset in each element such as a PLL, DPLL, serializer, deserializer, or synchronizer FIFO will be more apparent from the destinations of the reset signals in the various FIGS. described earlier.

As has been mentioned, the conditions under which the various types of resets are effected may be programmed into PLD core 80. For example, a global reset may be effected when a loss of lock signal is output by a PLL. As another example, a channel reset may be effected when any of the following conditions are detected: (1) a run length violation, (2) a digital (i.e., DPLL) loss of lock condition, or (3) a user-defined condition of error or abnormality (e.g., the user's logic in PLD core 80 has found an error in a data transmission). It should, of course, again be mentioned that the parameters used in detecting run length violation, loss of lock, and digital loss of lock are preferably programmable (e.g., via the programming of PLD core 80).

Figure 11A:
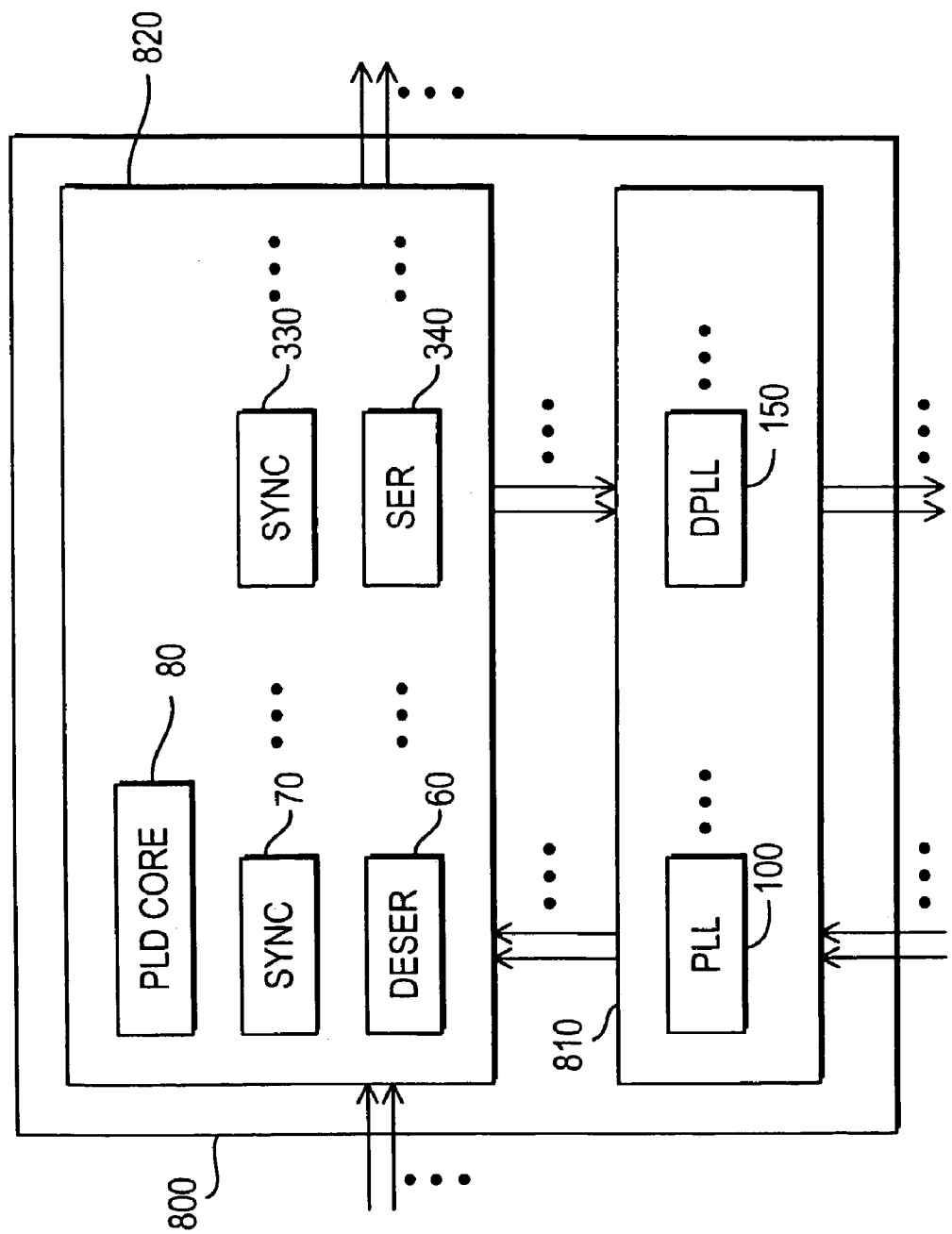
FIG. 11A is a simplified block diagram showing an alternative embodiment of circuitry of the type shown in FIG. 10 in accordance with the invention.

Although FIG. 10 shows everything on a single integrated circuit, in some embodiments it may be desirable to put some of the components and/or functions (in whole or in part) on a second integrated circuit. For example, FIG. 11A shows an illustrative embodiment in which all high frequency PLLs (like PLLs 100 in FIG. 10) and all DPLLs (like 150 in FIG. 10) are provided on one chip (integrated circuit) 810 in a multi-chip module 800. The other major functional components in FIG. 10 (e.g., deserializers 60, serializers 340, synchronizers 70 and 330, and PLD core 80) are provided on a second chip (integrated circuit) 820 in the multi-chip module. Although separate from one another, chips 810 and 820 are preferably closely coupled to one another in the multi-chip module. For example, differential signaling may be used for all or most signals passing between chips 810 and 820. For some purposes (such as CDR and certain non-CDR but typically high frequency signaling), chip 820 may communicate with external circuitry via chip 810. For other purposes, chip 820 may communicate directly with external circuitry. Separating the high frequency PLLs and DPLLs from other circuitry such as PLD core 80 may help to reduce high frequency interference with the operation of that other circuitry. Although FIG. 11A does not show how the various elements in chips 810 and 820 are interconnected, it will be understood that these interconnections can be basically as shown in FIG. 10.

Figure 11B:
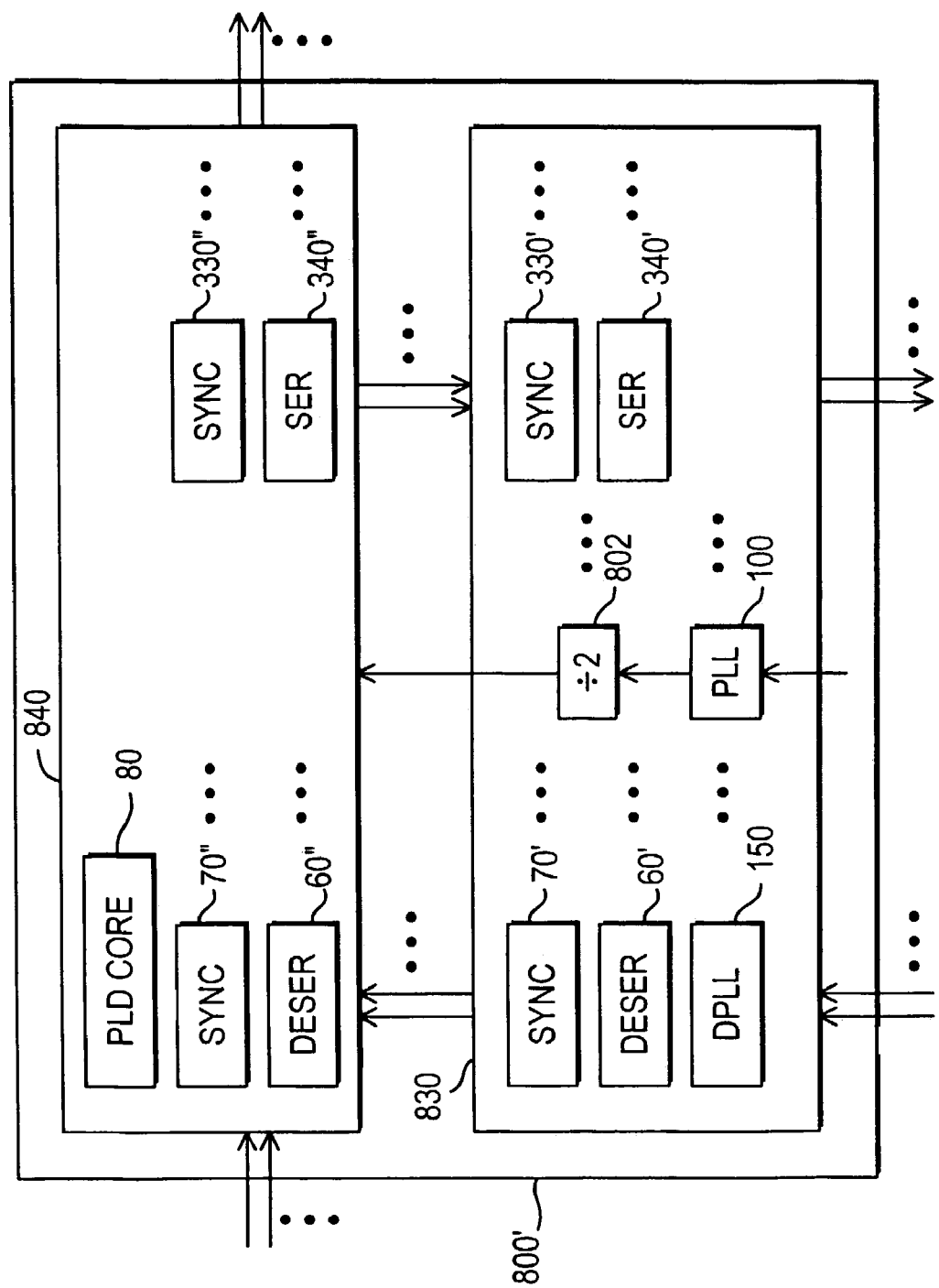
FIG. 11B is a simplified block diagram showing another alternative embodiment of circuitry of the type shown in FIG. 10 in accordance with the invention.

FIG. 11B shows another illustrative embodiment of a multi-chip module 800' in accordance with the invention. In FIG. 11B one chip 830 of the multi-chip module includes all high frequency PLLs 100 and DPLLs 150' as in FIG. 11A (chip 810). In addition to this circuitry chip 830 also includes circuit 802 for dividing the output signal of PLL 100 by 2 and applying the result to chip 840. Chip 830 also includes deserializers 60', synchronizers 70', synchronizers 330', serializers 340'. Chip 830 is set up to do part of the work required to translate signals between a high-frequency external (e.g., a CDR) clock regime and a lower frequency PLD core clock regime. In particular, chip 830 performs the higher frequency part of this task. Chip 840 performs the lower frequency part of the task. Thus chip 840 has PLD core 80 and additional elements 60", 70", 330", and 340" that are respectively similar to elements 60', 70', 330', and 340', but that operate at lower frequencies. In the depicted illustrative embodiment chip 830 performs all tasks necessary to translate signals between the highest (or external) frequency to be associated with the information represented by those signals and one-half that highest frequency. Chip 840 performs the tasks necessary to translate signals between one-half the highest frequency and the PLD core clock frequency. The preceding is preferably true for both signal receiving and signal transmitting. In this way chip 840 does not have to receive or otherwise deal with any signals having more than one-half the highest or external clock signal frequency. For example, if the system is handling CDR signals having a 1.25 GHz clock signal frequency, chip 830 does everything necessary to step that frequency down to 625 MHz for application to chip 840. Chip 840 sees no data or clock signal having a frequency higher than 625 MHz. This contrasts with the FIG. 11A embodiment in which chip 820 must still handle the highest frequency clock signals (e.g., from chip 810), although it does not have on-board high frequency PLL or DPLL circuitry.

A possible limitation of the FIG. 11B embodiment is that the overall frequency transformation must generally be a multiple of the divisor associated with element 802. (This divisor is not limited to being 2, but can be other numbers such as 3 or 4.) If the divisor is 2, for example, the system cannot conveniently deserialize or serialize odd word lengths (e.g., word lengths such as 3, 5, 7, etc.). As in the case of FIG. 11A, differential signaling is preferably used for most or at least many of the signals passing between chips 830 and 840.

In considering the FIG. 11B embodiment, it will be appreciated that because the data rate on data links between chips 830 and 840 is possibly less than the highest frequency data rate associated with a data connection of chip 830 to external circuitry, one external data connection of chip 830 may require more than one data link between chips 830 and 840. For example, if the divisor associated with circuit 802 in FIG. 11B is 2, then each data connection of chip 830 to external circuitry requires two data links between chips 830 and 840. This will be more apparent from the following discussion of FIGS. 13A and 13B. Both of these FIGS. assume that the divisor associated with circuit 802 in FIG. 11B is 2, but it will be apparent how the FIGS. 13A and 13B circuits can be modified for other divisor values.

Figure 13A:
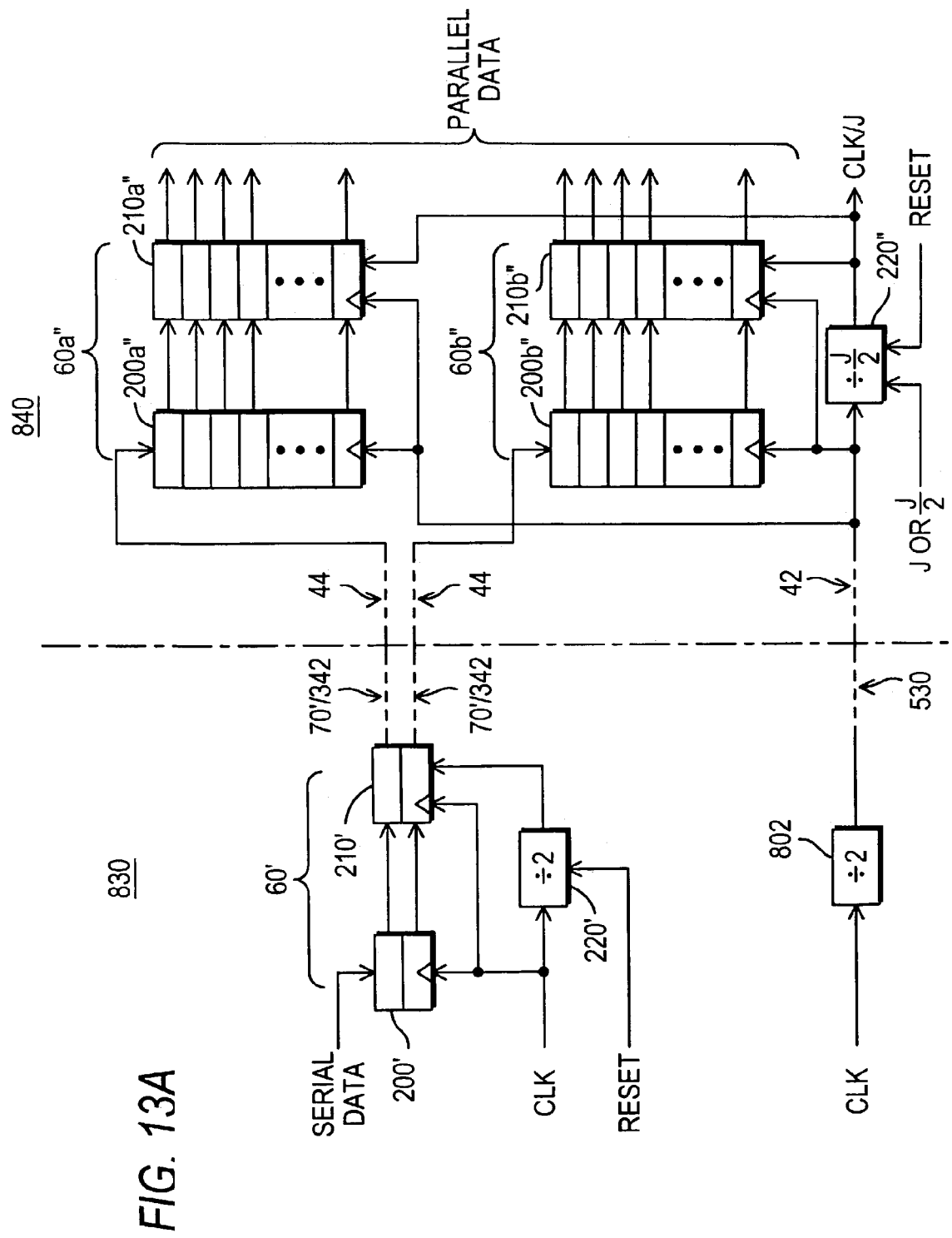
FIG. 13A is a simplified schematic block diagram showing an illustrative embodiment of a representative portion of the FIG. 11B circuitry in more detail.

FIG. 13A shows representative portions of data receiver circuitry in chips 830 and 840 in more detail. Deserializer 60' is very much like deserializer 60 in FIG. 5, except that it converts the serial input data signal having clock rate CLK to two parallel data output signals, each having clock rate CLK/2 and each containing a respective half of the original serial data input signal information. (Of course, these two output signals are still serial data signals.) Each of these two data output signals may pass separately through other circuitry on chip 830 (e.g., synchronizers 70' (FIG. 11B) and output drivers (like output drivers 342 in FIG. 10)), and are then applied to chip 840. Synchronizers 70' may be used in these signal paths to help re-time the data output signals for better synchronization with the CLK/2 output signal of divider 802, which output signal also passes out of chip 830 through other circuitry such as an output driver (e.g., like output driver 530 in FIG. 10) for application to chip 840. (Such re-timing may be necessary or helpful because deserializer 60' is working with a recovered CLK signal from a DPLL 150 on chip 830, but divider 802 is working with the output signal of a PLL 100 on chip 830. These two signals have the same frequency, but they may have different phases.)

On chip 840 in FIG. 13A each incoming data signal may initially pass through still other circuitry such as input drivers (e.g., like input drivers 44 in FIG. 10), and is then applied to a respective one of deserializers 60a" and 60b". (Deserializers 60a" and 60b" are shown sharing a single divider circuit 220", but separate divider circuits can be used instead if desired.) Each of deserializers 60" is again similar to deserializer 60 in FIG. 5, except that (as will now be clear) each deserializer 60" operates on only half of the original input serial data. In addition, the associated divider circuit 220" is only required to divide the CLK/2 signal it receives by J/2 (not J). The parallel output signals of both of deserializers 60a" and 60b" are collectively the full parallel data output version of the original serial data input signal. The parallel output signals can be further processed as described above (e.g., in connection with FIG. 10). For example, a synchronizer 70" on chip 840 may be used to re-time the parallel data signals to a clock regime associated with PLD core 80.

Figure 13B:
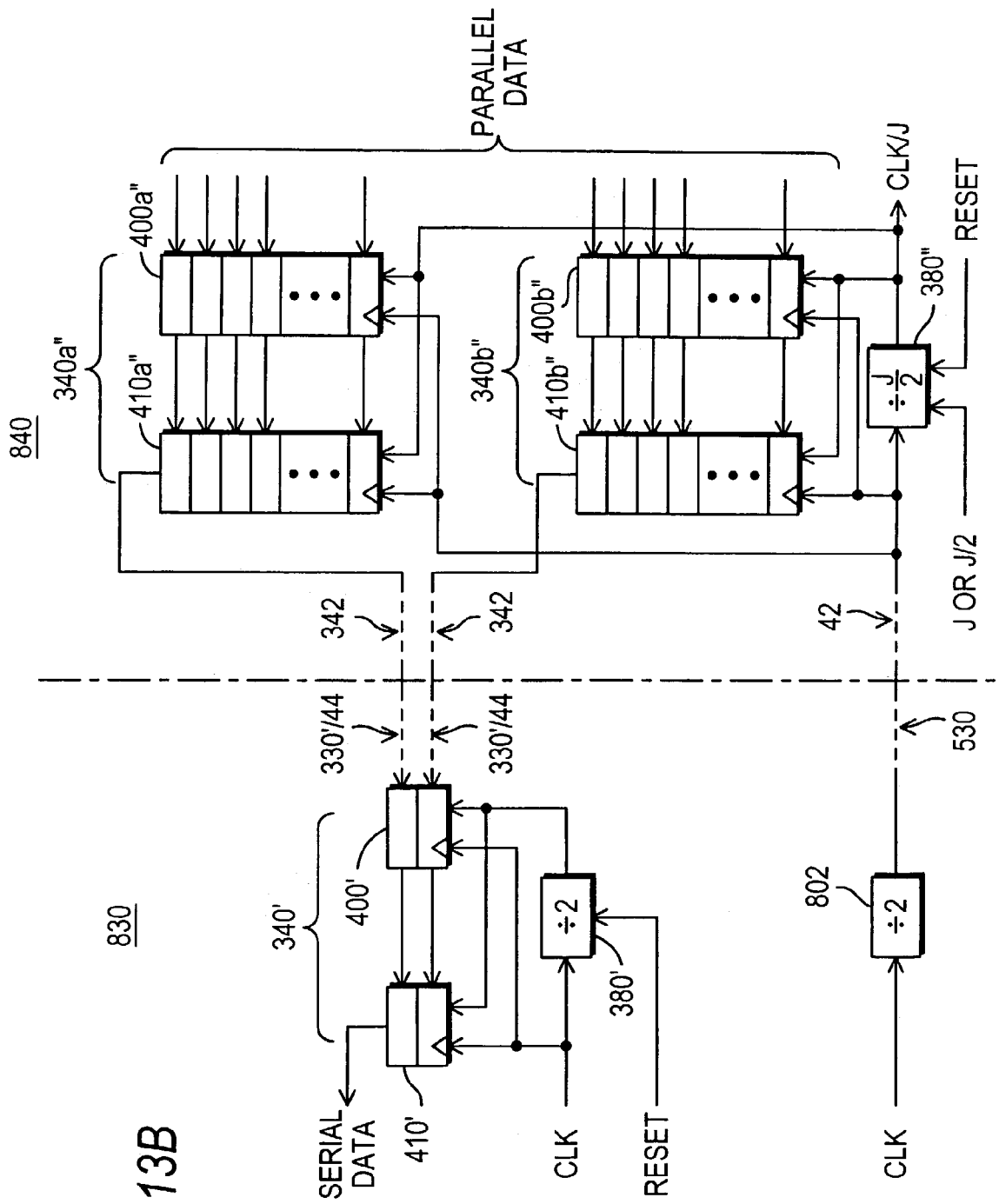
FIG. 13B is a simplified schematic block diagram showing another representative portion of the FIG. 11B circuitry in more detail.

FIG. 13B shows representative portions of data transmitter circuitry in chips 830 and 840 in more detail. Serializers 340a" and 340b" are each similar to serialize 340 in FIG. 9. Serializers 340a" and 340b" are shown sharing a common divider circuit 380", but each serializer could have its own divider circuit if desired. Each of serializers 340a" and 340b" converts a respective half of the total parallel input data to a respective one of two serial output signals. These signals leave chip 840 (e.g., via output drivers like output drivers 342 in FIG. 10) and are applied to chip 830. Input drivers (e.g., like 44 in FIG. 10) and other circuitry (e.g., synchronizers 330') on chip 830 receive and process these signals for application in parallel to the input side of serializer 340'. (Synchronizer 330' may be used to re-time the data signals from the PLL-based clock regime used by serializers 340a" and 340b" on chip 840 to the DPLL-based clock regime used by serializer 340' on chip 830.) Serializer 340' is again similar to serializer 340 in FIG. 9 and converts the two data signals it receives in parallel to a single serial data output signal.

FIGS. 13A and 13B thus show how some of the elements in chips 830 and 840 in FIG. 11B may be interconnected. Other interconnections among the FIG. 11B elements may be generally as shown in FIG. 10.

Figure 11C:
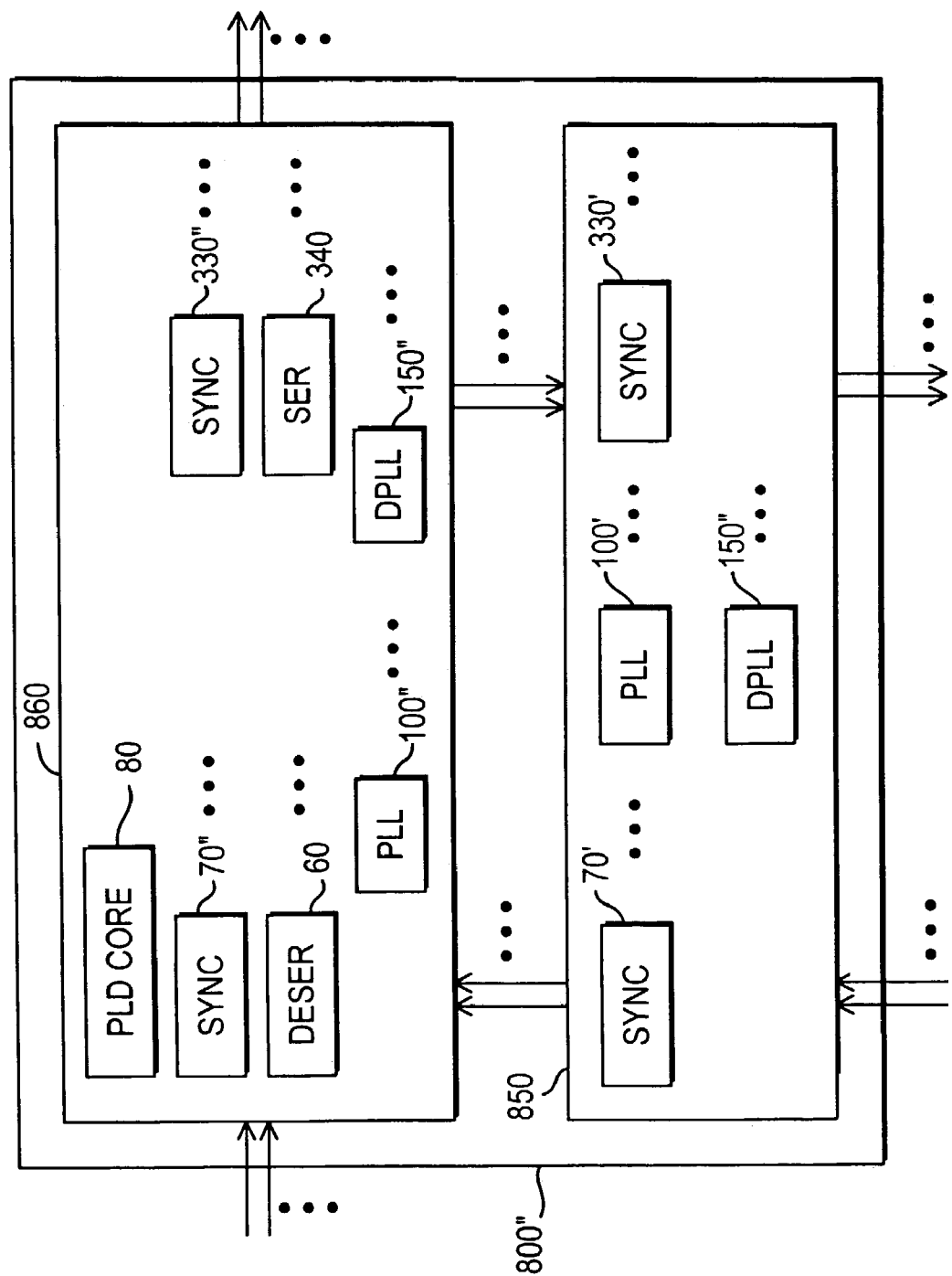
FIG. 11C is a simplified block diagram showing still another alternative embodiment of circuitry of the type shown in FIG. 10 in accordance with the invention.

FIG. 11C shows yet another illustrative multi-chip module embodiment 800" in accordance with the invention. In this embodiment chip 860 can be the same or substantially the same as device 500 in FIG. 10. However, interface chip 850 is added to "clean up" CDR signals received by the system before passing those signals on to chip 860, and/or to similarly "clean up" CDR signals produced by chip 860 prior to passing those signals on to external circuitry. Thus chip 850 may receive CDR signals from external circuitry. Chip 850 recovers the clock from those signals using PLL 100' and DPLL 150'. Chip 850 passes the CDR signals through synchronizer 70' (to buffer and/or re-time those signals), and it may also output an associated REFCLK signal). These output CDR signals of chip 850 will generally have better signal quality than what chip 850 received, although in all other respects the input and output CDR signals will be the same. Chip 860 receives these chip 850 output signals and can handle them more reliably than the original signals because they are of better quality. Deserialization is not required in chip 850 and can be performed only in chip 860. Outbound signal processing through chip 850 is analogous and involves use of synchronizer 330' to buffer and/or re-time between input CDR signals from chip 860 and output CDR signals from chip 850 to external circuitry. As in FIGS. 11A and 11B, differential signaling is preferably used for many (if not most or all) signals passing between chips 850 and 860. And, as is at least implied by the foregoing, CDR signaling is used between chips 850 and 860 for signals that are either received by module 800" as CDR signals or that will be output by module 800" as CDR signals. As in the case of FIGS. 11A and 11B, interconnections among the various elements shown in FIG. 11C are generally as shown in FIG. 10.

In the further discussion that follows all of the various types of multi-chip modules 800, 800', and 800" that have been shown and described will simply be referred to using reference number 800 as a generic identifier.

FIG. 12 illustrates a PLD 500 or multi-chip module 800 of this invention in a data processing system 1002. Data processing system 1002 may include one or more of the following components: a processor 1004; memory 1006; I/O circuitry 1008; and peripheral devices 1010. These components are coupled together by a system bus or other interconnections 1020 and are populated on a circuit board 1030 which is contained in an end-user system 1040. Any of the interconnections between element 500/800 and any other elements may be made using the above-described CDR or LVDS signaling.

System 1002 can be used in a wide variety of applications, such as computer networking, data networking, instrumentation, video processing, digital signal processing, or any other application where the advantage of using programmable or reprogrammable logic is desirable. PLD/module 500/800 can be used to perform a variety of different logic functions. For example, PLD/module 500/800 can be configured as a processor or controller that works in cooperation with processor 1004. PLD/module 500/800 may also be used as an arbiter for arbitrating access to a shared resource in system 1002. In yet another example, PLD/module 500/800 can be configured as an interface between processor 1004 and one of the other components in system 1002. It should be noted that system 1002 is only exemplary, and that the true scope and spirit of the invention should be indicated by the following claims.

Various technologies can be used to implement PLDs 500 or multi-chip modules 800 having the features of this invention, as well as the various components of those devices (e.g., the above-described PLCs and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of this invention, and that various modifications can be made by those skilled in the art without departing from the scope and spirit of the invention. For example, the numbers of the various types of resources on components 500/600 can be different from the numbers present in the depicted and described illustrative embodiments.

At least some of the embodiments shown herein and described above are capable of operating modes in which there is no necessary limit to the run-length of the incoming CDR or CDR-type signal. In other words, these embodiments of the circuitry can operate with no requirement that there be no more than a certain number of clock signal cycles between transitions in the level of the incoming CDR or CDR-type signal. A run length limit is usually required for CDR or CDR-type signaling. (To simplify the terminology, the term "CDR" is used herein for any CDR or CDR-type signal.) This means, for example, that the incoming data can have any number of consecutive ones and/or any number of consecutive zeros without upsetting the operation of the circuitry. This capability eliminates run length constraints on the signals that appropriate embodiments of the circuitry can handle. This in turn increases a user's flexibility of choice regarding the signal coding to be employed. Increased flexibility of this kind allows these embodiments of the invention to support more signaling protocols and therefore to be used in a wider range of applications.

Embodiments of the invention that can operate with no run length limitations are generally those that have the following characteristics: First, the data clock and the reference clock (e.g., respectively the clock information in the data signal on leads 34a/b and the reference clock signal on leads 26a/b in FIG. 1) should be derived from the same ultimate source (e.g., the same crystal oscillator). Thus embodiments of the general type shown in FIG. 1 can operate with no run length limit (if the other characteristics described in this paragraph are satisfied), but embodiments of the type shown in FIG. 1A are generally not suitable for operation with no run length limit. Second, during long runs, any phase difference ("skew") between the received data and reference clock signals should be relatively stable. In other words, any change in this skew should be within a relatively narrow range during any long runs. Third, before a long run can be tolerated, a training pattern of sufficient length (and free of long runs) should be transmitted to allow the receiver apparatus to properly determine and compensate for any static skew between the data and reference clock signals. The following discussion assumes that the circuitry and signaling being discussed have these three characteristics. Such circuitry is therefore sometimes referred to in the following as "unlimited-run-length-compatible embodiments of the circuitry of this invention" or the like. (Of course, any such embodiments can also be used in applications having run length limits of any desired length.)

The unlimited-run-length-compatible embodiments of the circuitry of this invention can operate without a run length limit because of the following attributes. First, the circuitry receives a reference clock signal (e.g., 26a/b in FIG. 1) that gives the receiver circuitry the frequency of the clock information in the accompanying CDR signal (e.g., 34a/b in FIG. 1). The receiver circuitry therefore does not need to recover the frequency of the clock signal from the CDR signal. (See, for example, FIG. 2, which shows processing of the REFCLK signal to produce eight candidate recovered CLK signals without any dependence on the CDR signal.) The receiver circuitry only needs to recover from the CDR signal the proper phase of the clock information in the CDR signal, not the frequency of that clock information.

A second attribute of the circuitry of this invention that makes it possible for the unlimited-run-length-compatible embodiments of the circuitry to operate without a run length limit is the fact that a change in recovered clock signal phase is only made in response to transitions in the CDR signal that are not in phase with the currently selected recovered clock signal phase. In other words, in the absence of transitions in the CDR signal, whatever phase selection has been made for the recovered clock signal remains the phase selection for that signal. The recovered clock signal phase selection is completely stable in the absence of CDR signal transitions, so the circuitry can tolerate indefinitely long time periods between transitions in the CDR signal.

The point made in the immediately preceding paragraph can be better understood by looking again at FIG. 4, for example. As described earlier in this specification, phase detector 160 produces a digital UP pulse or a digital DOWN pulse only when a transition in the CDR signal ("DATA") is not in phase with the currently selected RECOVERED CLOCK signal(s) output by multiplexer 190. As long as there are no transitions in the CDR DATA signal, no digital UP or DOWN pulses are output by phase detector 160. This means no change in the state of state machine 162, and also no change in the contents of up/down counter 164, both of components 162 and 164 also being essentially digital components and acting essentially as a net digital integrator of the UP and DOWN pulses. No change in the outputs of digital components 162 and 164 means no change in the recovered clock signal phase selections made by elements 180/182. Hence the circuitry is completely stable with respect to recovered clock signal phase (and frequency, as demonstrated earlier) in the absence of CDR signal transitions, for as long as the absence of such transitions continues. Whenever the CDR DATA signal again begins to have transitions, and if those transitions are not optimally in phase with the RECOVERED CLOCK signal currently being output, phase detector 160 again begins to output digital UP and/or DOWN pulses as are appropriate to change the RECOVERED CLOCK signal to again bring it into best-achievable phase with the CDR DATA signal transitions.

Although not believed necessary for understanding or practicing the presently claimed invention, since the filing of the parent of this specification several other commonly owned patent applications have been filed that may relate, inter alia, to aspects of circuitry for handling CDR signals. These include Lee et al. U.S. patent application Ser. No. 10/059,014, filed Jan. 29, 2002, Lee et al. U.S. patent application Ser. No. 10/093,785, filed Mar. 6, 2002, Venkata et al. U.S. patent application Ser. No. 10/195,229, filed Jul. 11, 2002, Andrasic et al. U.S. patent application Ser. No. 10/099,707, filed Mar. 13, 2002, Venkata et al. U.S. patent application Ser. No. 10/273,899, filed Oct. 16, 2002, Starr et al. U.S. patent application Ser. No. 10/209,633, filed Jul. 30, 2002, Venkata et al. U.S. patent application Ser. No. 10/317, 262, filed Dec. 10, 2002, Venkata et al. U.S. patent application Ser. No. 10/317,264, filed Dec. 10, 2002, Venkata et al. U.S. patent application Ser. No. 10/349,541, filed Jan. 21, 2003, and concurrently filed Lui et al. U.S. patent application Ser. No. 10/454,626. All of these reference are hereby incorporated by reference herein in their entireties.

The invention claimed is:

1. Circuitry for recovering clock information from a clock data recovery (CDR) signal comprising:

receiver circuitry for receiving the CDR signal and an external reference clock signal;

first circuitry for producing from the external reference clock signal a plurality of differently phase-shifted candidate recovered clock signals; and second circuitry for producing a recovered clock signal based on a selection from among the candidate recovered clock signals, the selection being based on a digitalized comparison between phases of transitions in the CDR signal and the recovered clock signal, and wherein the second circuitry maintains the selection it has made until subsequent transitions in the CDR signal have closer proximity to transitions in another of the candidate recovered clock signals, so that during an absence in CDR signal transitions, no change is made in the selection.

2. The circuitry defined in claim 1 wherein the second circuitry comprises:

phase detector circuitry for producing an output signal pulse when a CDR signal transition has phase that deviates from the phase of the recovered clock signal.

3. The circuitry defined in claim 2 wherein the output signal pulse is produced only when the CDR signal transition has phase that is ahead of the recovered clock signal phase, and wherein the phase detector circuitry produces a separately recognizable output signal pulse when the CDR signal transition has phase that is behind the recovered clock signal phase.

4. The circuitry defined in claim 3 wherein the second circuitry further comprises:

digital integrator circuitry for integrating together the output signal pulses and the separately recognizable output signal pulses.

5. The circuitry defined in claim 4 wherein the digital integrator circuitry is configured to output a net count of the output signal pulses and the separately recognizable output signal pulses, counting the output pulses in one direction and counting the separately recognizable output signal pulses in a second, opposite direction.

6. The circuitry defined in claim 1 wherein the second circuitry comprises:
    first subcircuitry for preliminarily selecting two of the candidate recovered clock signals that are adjacent to one another in phase; and
    second subcircuitry for finally selecting one of the preliminarily selected candidate recovered clock signals as the recovered clock signal.

7. The circuitry defined in claim 1 wherein the second circuitry comprises:
    first subcircuitry for preliminarily selecting two of the candidate recovered clock signals that are adjacent to one another in phase; and
    second subcircuitry for interpolating between the preliminarily selected candidate recovered clock signals to produce the recovered clock signal.

8. The circuitry defined in claim 1 wherein the first circuitry comprises phase locked loop circuitry.

9. A method for recovering clock information from a clock data recovery (CDR) signal comprising:
    receiving the CDR signal and an external reference clock signal;
    producing a plurality of differently phase-shifted candidate recovered clock signals from the external reference clock signal having frequency related to the clock information frequency; and
    selecting from the candidate recovered clock signals at least one such signal based on proximity between the phases of that signal and transitions in the CDR signal, the selected candidate recovered clock signal being used as a basis for deriving a recovered clock signal and maintaining the selection until subsequent transitions in the CDR signal have closer proximity to transitions in another of the candidate recovered clock signals, so that during an absence in CDR signal transitions, no change is made in the selection.

10. Circuitry for recovering clock information from a clock data recovery (CDR) signal without the CDR signal having to satisfy a run length requirement comprising:
    receiver circuitry for receiving the CDR signal and an external reference clock signal;
    first circuitry for producing from the external reference clock signal, which has frequency having a first predetermined relationship to frequency of the clock information, a plurality of candidate recovered clock signals, all of the candidate recovered clock signals having frequency that has a second predetermined relationship to the frequency of the clock information, and the candidate recovered clock signals having respective different phases that subdivide a cycle of the clock information; and
    second circuitry for selecting at least one of the candidate recovered signals for use as a basis for a recovered clock signal based on proximity of transitions in the CDR signal to transitions in the selected candidate recovered clock signal, the second circuitry maintaining a selection it has made until subsequent transitions in the CDR signal have closer proximity to transitions in another of the candidate recovered clock signals, so that during an absence in CDR signal transitions, no change is made in the selection.

11. The circuitry defined in claim 10 wherein the first and second predetermined relationships are the same relationship.

12. The circuitry defined in claim 11 wherein the first and second predetermined relationships are equality to the frequency of the clock information.

13. The circuitry defined in claim 10 wherein the first circuitry comprises phase locked loop circuitry.

14. The circuitry defined in claim 10 wherein the second circuitry comprises first subcircuitry for producing digital signals indicative of a phase comparison between transitions in the recovered clock signal and transitions in the CDR signal.

15. The circuitry defined in claim 14 wherein the second circuitry comprises second subcircuitry for digitally processing the digital signals to produce a digital selection of at least one candidate recovered clock signal.

16. The circuitry defined in claim 10 wherein the second circuitry comprises:
    first subcircuitry for preliminarily selecting two of the candidate recovered clock signals that are adjacent to one another in phase; and
    second subcircuitry for finally selecting one of the two preliminarily selected candidate recovered clock signals as the recovered clock signal.

17. The circuitry defined in claim 10 wherein the second circuitry comprises:
    first subcircuitry for preliminarily selecting two of the candidate recovered clock signals that are adjacent to one another in phase; and
    second subcircuitry for interpolating between the preliminarily selected candidate recovered clock signals to produce the recovered clock signal.

* * * * *